(12) United States Patent
Hara

(10) Patent No.: US 7,795,619 B2
(45) Date of Patent: Sep. 14, 2010

(54) SEMICONDUCTOR DEVICE

(75) Inventor: Akito Hara, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/138,431

(22) Filed: May 27, 2005

(65) Prior Publication Data
US 2006/0170046 A1 Aug. 3, 2006

(30) Foreign Application Priority Data
Jan. 31, 2005 (JP) ............................. 2005-023968

(51) Int. Cl.
*H01L 31/036* (2006.01)
(52) U.S. Cl. .................. 257/67; 257/59; 257/72; 257/E27.001
(58) Field of Classification Search .................. 257/67, 257/347; 438/149, 152, 155, 479, 517
See application file for complete search history.

(56) References Cited

U.S. PATENT DOCUMENTS

| 5,355,022 A | | 10/1994 | Sugahara et al. |
| 5,504,376 A | * | 4/1996 | Sugahara et al. ............. 257/768 |
| 5,998,838 A | * | 12/1999 | Tanabe et al. ................ 257/347 |
| 6,600,173 B2 | * | 7/2003 | Tiwari ........................ 257/74 |
| 6,734,463 B2 | * | 5/2004 | Ishikawa ..................... 257/79 |

FOREIGN PATENT DOCUMENTS

| JP | 03-181120 A | | 8/1991 |
| JP | 5-198739 | | 8/1993 |
| JP | 05-335482 | * | 12/1993 |
| JP | 5-335482 | | 12/1993 |
| JP | 7-37867 | | 2/1995 |

OTHER PUBLICATIONS

Japanese Office Action dated Mar. 24, 2009 issued in corresponding Application No. 2005-023968.

* cited by examiner

*Primary Examiner*—Eugene Lee
*Assistant Examiner*—Anthony Ho
(74) *Attorney, Agent, or Firm*—Westerman, Hattori, Daniels & Adrian, LLP

(57) ABSTRACT

A method for manufacturing a semiconductor device, including the steps of: forming a shielding film 38 on a first insulating film 37; sequentially forming a second insulating film 39 and an amorphous semiconductor film 40 on the shielding film 38; melting the amorphous semiconductor film 40 at least in portions to be channels of thin-film transistors by irradiating an energy beam onto the amorphous semiconductor film 40, and converting the amorphous semiconductor film 40 into a polycrystalline semiconductor film 41; sequentially forming a gate insulating film 43*a* and a gate electrode 44*a* on the polycrystalline semiconductor film 41 on the channels; and forming source and drain regions 41*a* in the polycrystalline semiconductor film 41 on sides of the gate electrode 44*a*, and forming a TFT 60 by use of the source and drain regions 41*a*, the gate insulating film 43*a*, and the gate electrode 44*a*.

5 Claims, 18 Drawing Sheets

} 41

} 41

SEMICONDUCTOR DEVICE

CROSS-REFERENCE TO RELATED APPLICATIONS

This application is based on and claims priority of Japanese Patent Application No. 2005-023968 filed on Jan. 31, 2005, the entire contents of which are incorporated herein by reference.

BACKGROUND OF THE INVENTION

1. Field of the Invention

The present invention relates to a semiconductor device and a manufacturing method thereof.

2. Description of the Related Art

In recent years, semiconductor devices such as LSIs have been more and more miniaturized, and a gate length of a MOS transistor is becoming shorter than 90 nm. Along with such miniaturization, improvement in performance such as a shortened gate delay time is expected. However, in reality, some points have been noted, which include that an ON-state current is not improved as expected and that heat generated by an increase in power consumption becomes a problem. Accordingly, disadvantages have been newly caused by the miniaturization.

Consequently, in order to realize higher performance and higher integration of the semiconductor devices without miniaturization, a stacked semiconductor device including transistors stacked in three dimensions has been proposed as disclosed in Patent Documents 1 and 2.

Among these patent documents, Patent Document 1 has proposed a method for realizing a stacked semiconductor device by attaching a silicon substrate to a silicon substrate having transistors formed thereon and forming transistors on the upper silicon substrate.

Meanwhile, in Patent Document 2, a stacked semiconductor device is manufactured by sequentially stacking transistors on a silicon substrate.

Besides the methods described above, there is also a method for manufacturing a stacked semiconductor device by mounting semiconductor chips in three dimensions.

Furthermore, a technology related to the present invention is also disclosed in Patent Document 3.

[Patent Document 1]
Japanese Patent Laid-Open No. Hei 5 (1993)-198739
[Patent Document 2]
Japanese Patent Laid-Open No. Hei 5 (1993)-335482
[Patent Document 3]
Japanese Patent Laid-Open No. Hei 7 (1995)-37867

Incidentally, in the semiconductor device, it is required to form wirings for applying a voltage to gate electrodes and source and drain regions of transistors and to form interlayer insulating films. If transistors are formed on these wirings and films, the transistors have to be formed at a temperature equal to or lower than allowable temperature limits of the wirings and the interlayer insulating films.

When the wirings are made of aluminum, the allowable temperature limit of the wirings is about 400° C. that is a melting point of aluminum. Moreover, in copper wirings obtained by a damascene process or the like, when a temperature reaches about 400° C., a needle-shaped protrusion is formed on an upper surface of the copper wiring by regrowth of a copper crystal. Accordingly, the protrusion may short-circuit the upper and lower copper wirings. Moreover, the copper wirings may be disconnected.

Furthermore, in the case where a low dielectric constant insulating film is used as an insulating film which covers the wirings, since the low dielectric constant insulating film has poor heat resistance, transistors have to be formed thereon at a process temperature of 400° C. or lower.

However, in Patent Document 1 described above, as disclosed in the paragraph number 0039, a temperature as high as about 650° C. is required to attach two silicon substrates each other. Thus, such wirings and low dielectric constant insulating films as described above cannot be formed between upper and lower transistors.

Moreover, in Patent Document 2, as disclosed in the paragraph number 0013, amorphous silicon to be active regions of transistors is annealed to obtain polysilicon. However, since an annealing temperature is as high as 600° C., it is difficult to form wirings and low dielectric constant insulating films between upper and lower transistors.

SUMMARY OF THE INVENTION

According to one aspect of the present invention, a semiconductor device is provided, which includes: a semiconductor substrate; an interlayer insulating film, wiring, and a first insulating film, which are sequentially formed on the semiconductor substrate; a shielding film formed on the first insulating film; a second insulating film formed on the shielding film; and thin-film transistor which is formed on the second insulating film and has a polycrystalline semiconductor film as a channel.

Moreover, according to another aspect of the present invention, a method for manufacturing a semiconductor device is provided, which includes the steps of: sequentially forming an interlayer insulating film, wiring, and a first insulating film on a semiconductor substrate; forming a shielding film, which does any of reflection and attenuation of an energy beam, on the first insulating film; sequentially forming a second insulating film and an amorphous semiconductor film on the shielding film; irradiating a energy beam onto the amorphous semiconductor film to melt the amorphous semiconductor film at least in a portion to be a channel of a thin-film transistor, and converting the amorphous semiconductor film into a polycrystalline semiconductor film; patterning the polycrystalline semiconductor film into shape including the channel; sequentially forming a gate insulating film and gate electrode on the polycrystalline semiconductor film after the patterning; and forming source and drain regions by introducing impurities into the polycrystalline semiconductor beside the gate electrode, and constructing the thin-film transistor from the source and drain regions, the gate insulating film, and the gate electrode.

According to the present invention, before the amorphous semiconductor film is converted into the polycrystalline semiconductor film by irradiation of the energy beam, the shielding film which reflects or attenuates the energy beam is formed below the amorphous semiconductor film. Thus, an interlayer insulating film and wiring below the shielding film are not directly exposed to the energy beam. Accordingly, deterioration of these interlayer insulating film and wiring by heat of the energy beam is prevented.

Such an advantage is favorably obtained particularly when a laminated insulating film having a low dielectric constant insulating film with poor heat resistance is formed as the interlayer insulating film described above.

Moreover, when copper wiring is formed as the wiring, copper crystals hardly regrow into a needle shape by heat.

Thus, it is possible to prevent short-circuit between upper and lower copper wirings due to the regrown copper crystals. In addition, it is possible to prevent deterioration of a breakdown voltage between adjacent copper wirings. Moreover, disconnection can be suppressed.

Furthermore, the shielding film also functions as a reinforcing film which reinforces mechanical strength of the semiconductor device. Thus, a mechanical damage caused in the step of forming the thin-film transistor is hardly passed down below the shielding film. Accordingly, damages inflicted on the interlayer insulating film and the wiring during the process are reduced. Thus, occurrence of defects in the film and the wirings can be prevented.

Moreover, a MOS transistor is formed on the semiconductor substrate before the interlayer insulating film is formed. Thus, it is possible to obtain a stacked semiconductor device in which the MOS transistor and the thin-film transistor are stacked while preventing deterioration of the wiring and the interlayer insulating film due to the energy beam.

DESCRIPTION OF THE PREFERRED EMBODIMENTS

Next, with reference to the accompanying drawings, embodiments of the present invention will be described in detail.

(1) First Embodiment

Figure 1A:
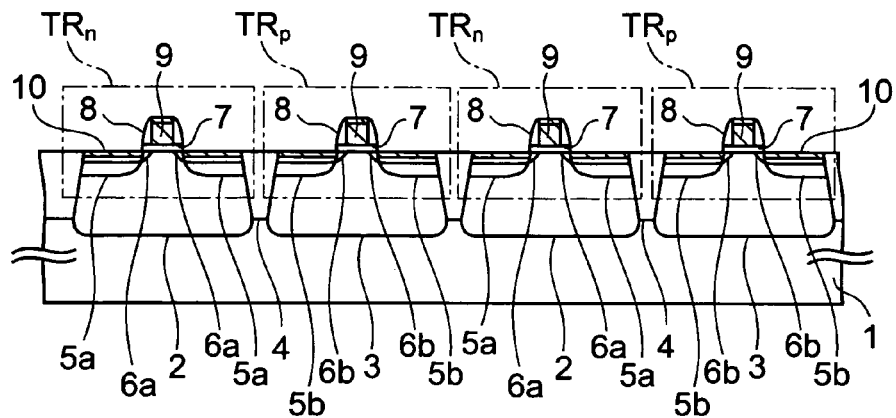
FIGS. 1A to 1S are cross-sectional views in the middle of manufacturing a semiconductor device according to a first embodiment of the present invention.
Figure 1B:
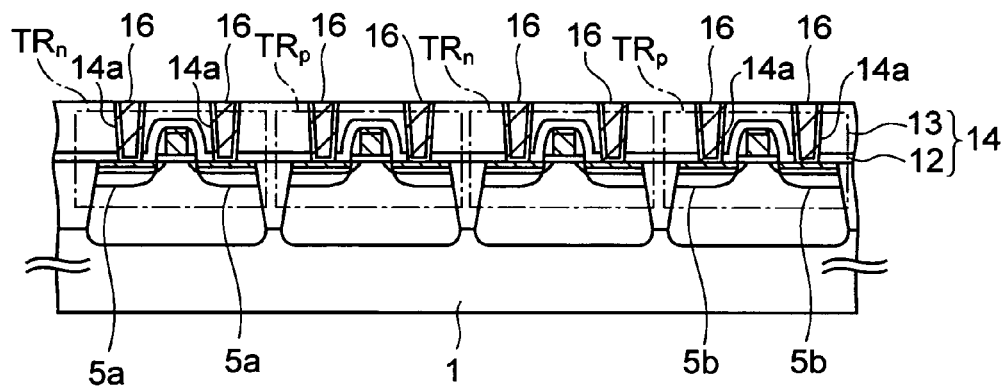
Figure 1C:
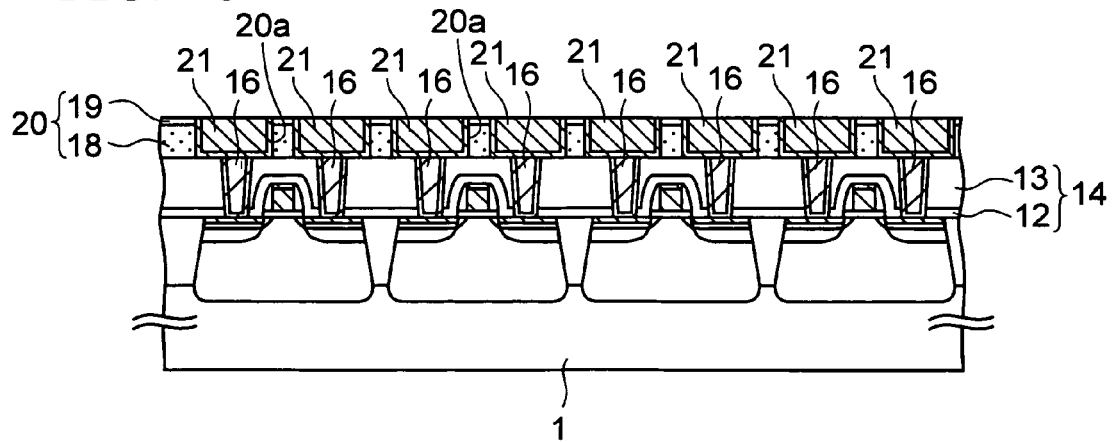
Figure 1D:
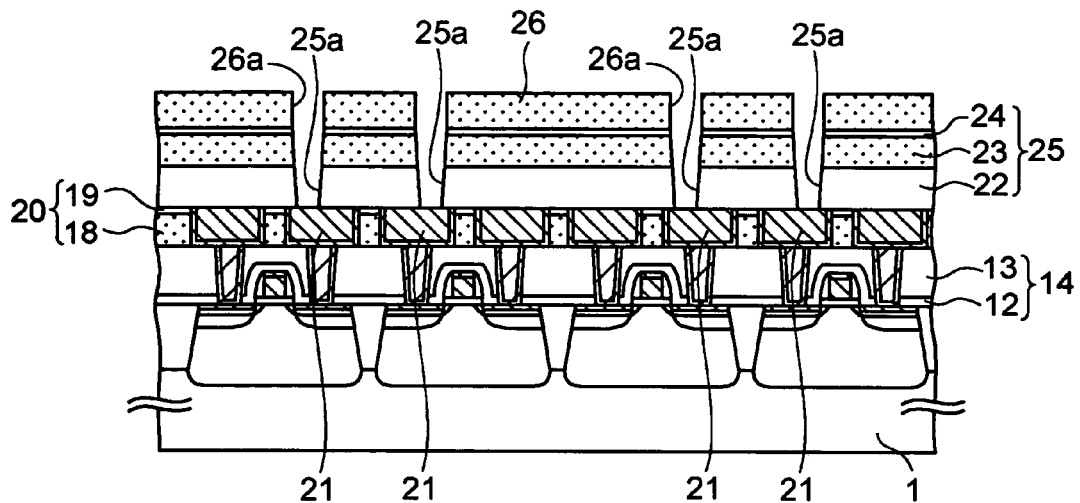
Figure 1E:
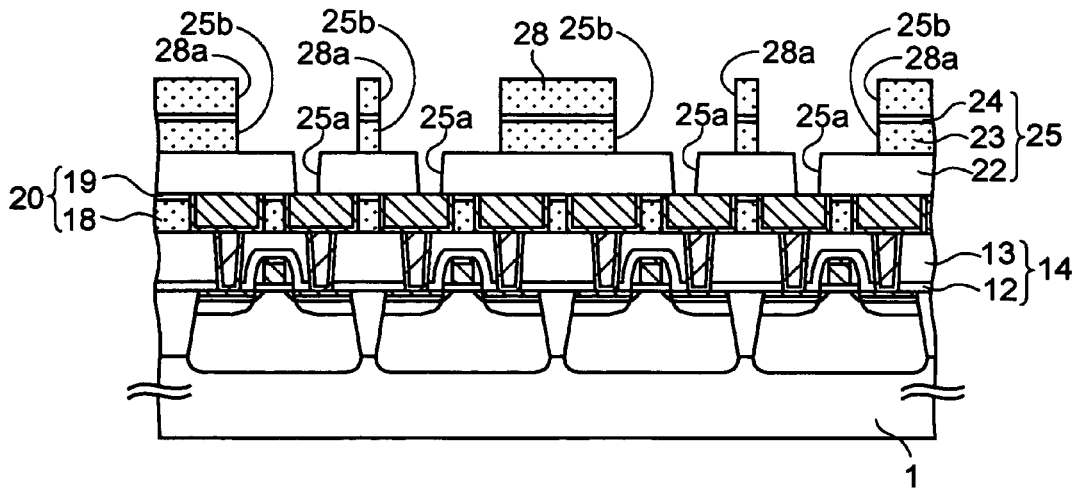
Figure 1F:
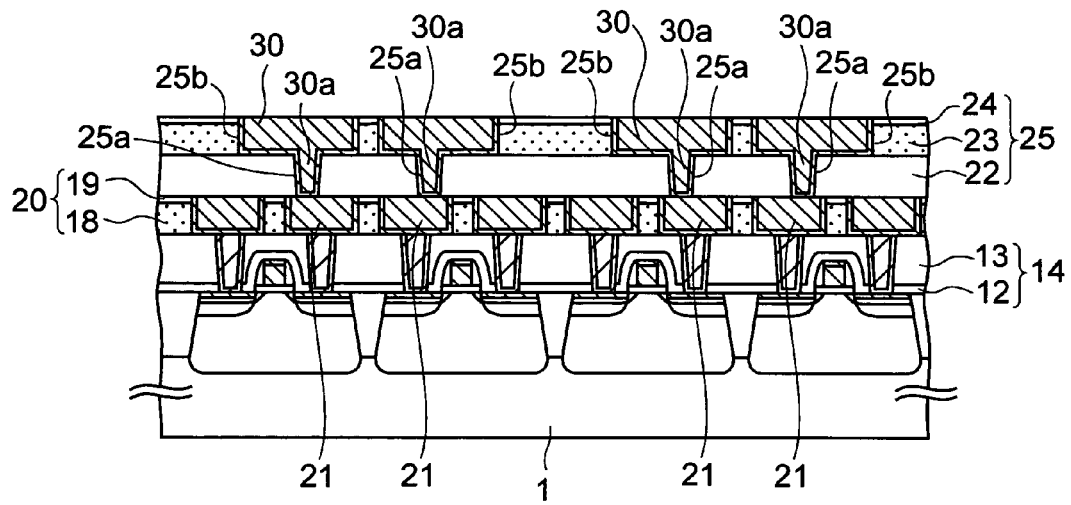
Figure 1G:
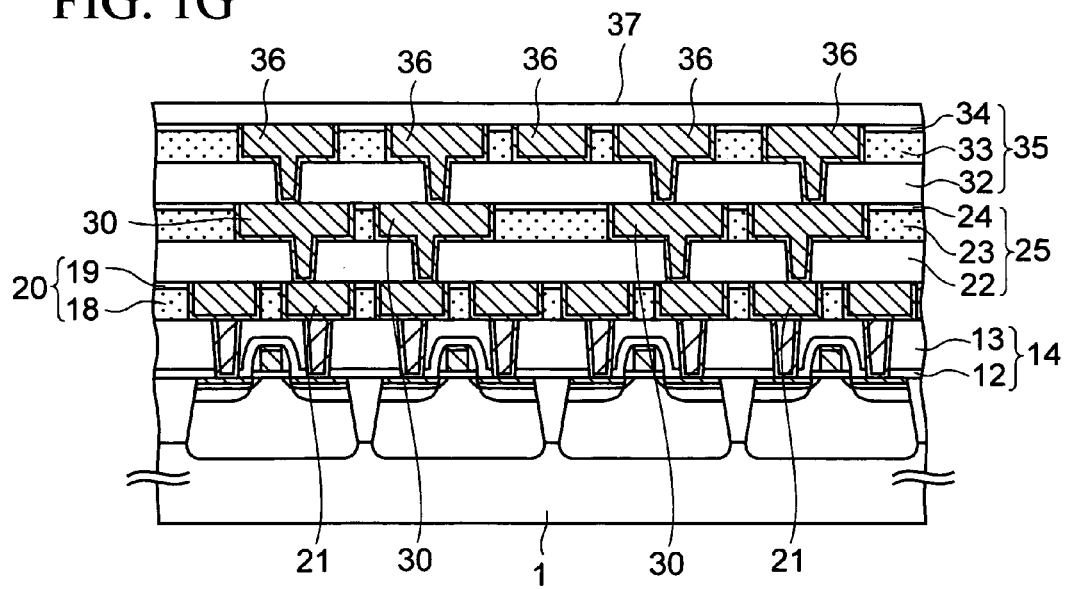
Figure 1H:
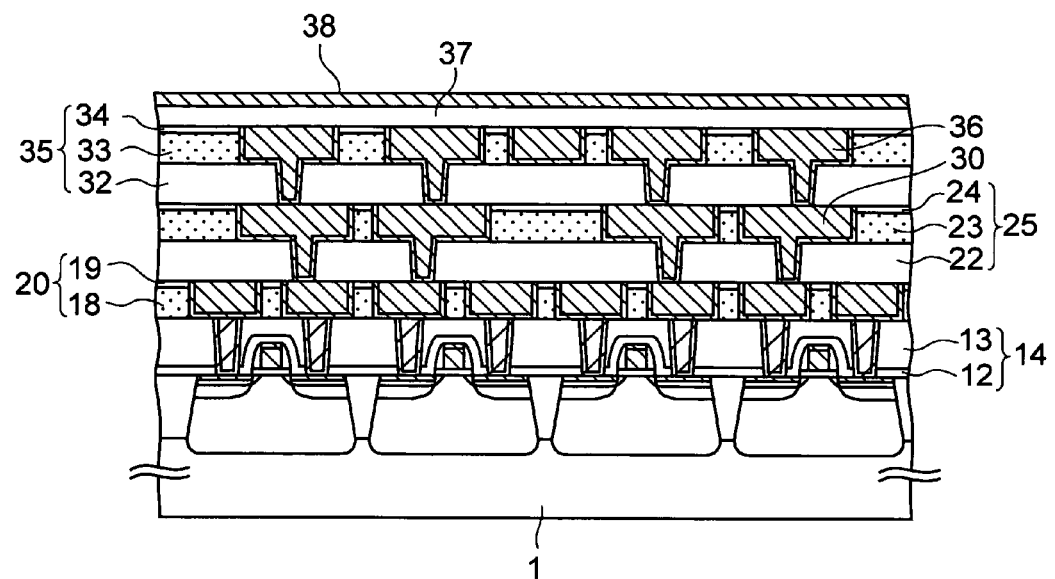
Figure 1I:
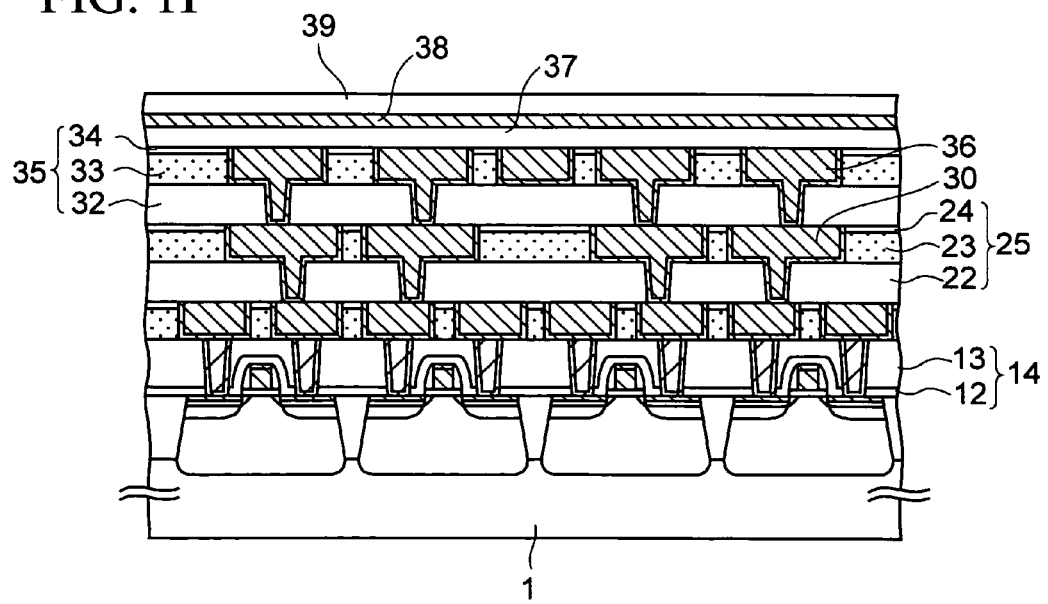
Figure 1J:
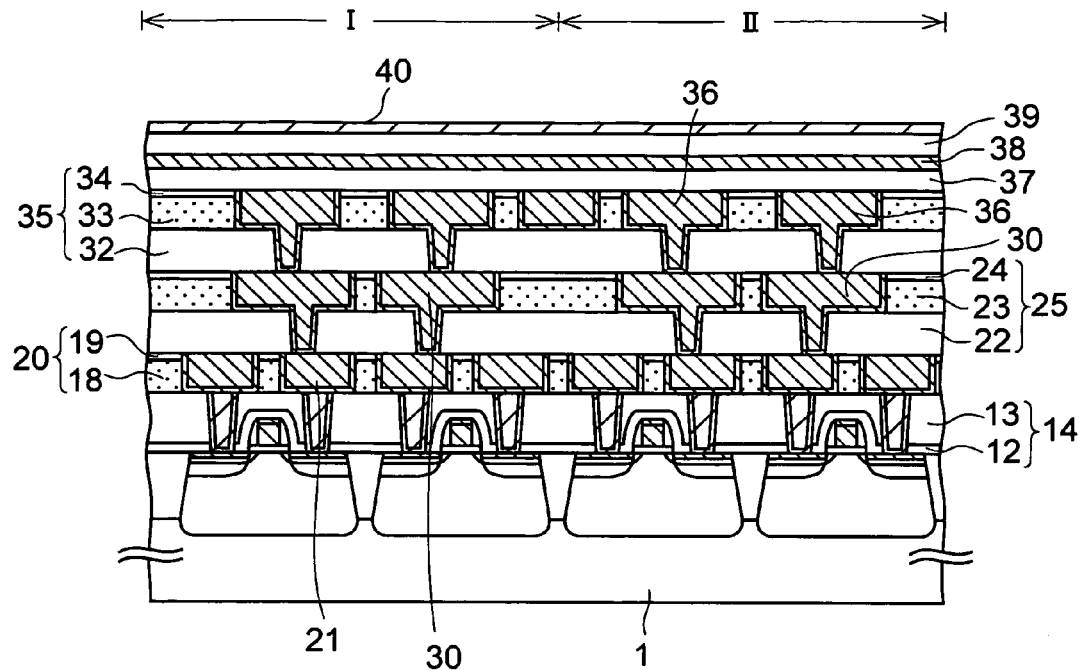
Figure 1K:
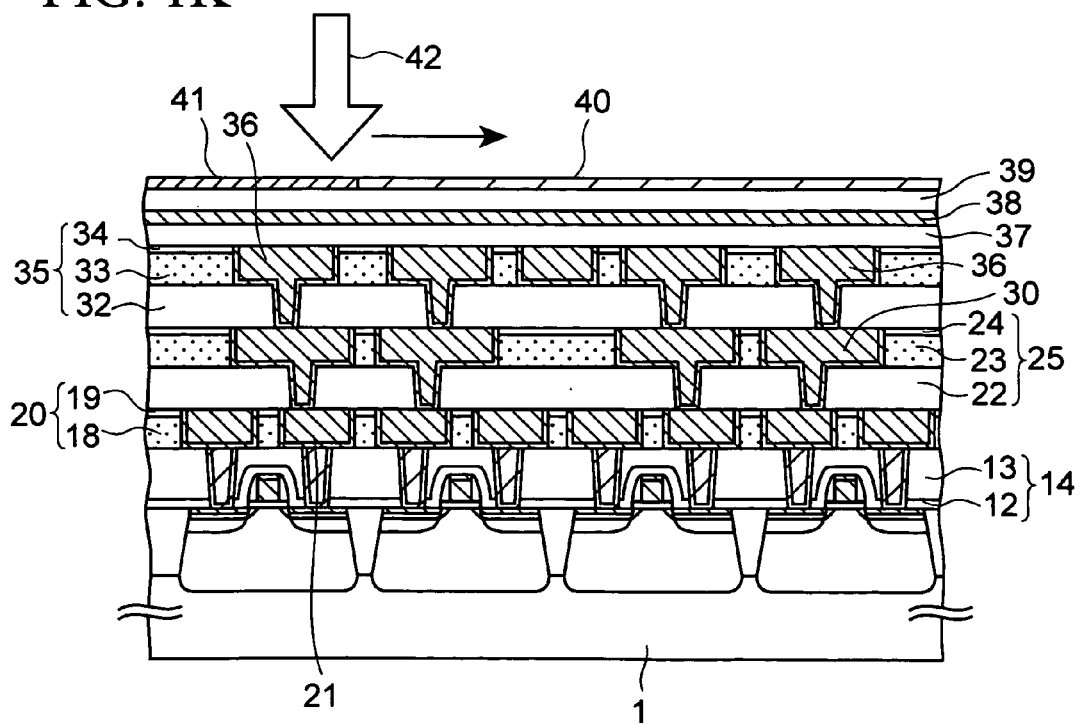
Figure 1L:
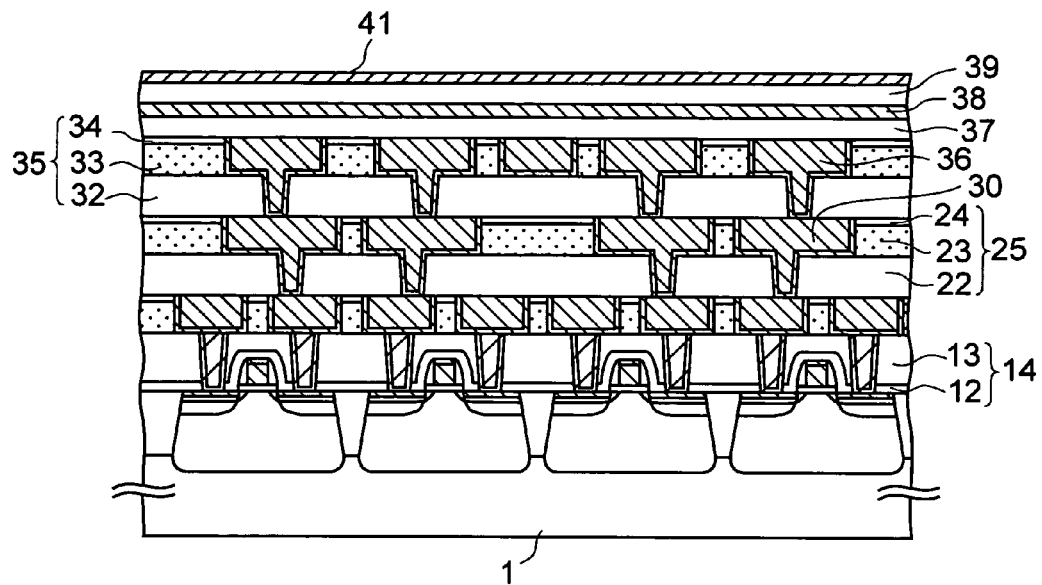
Figure 1M:
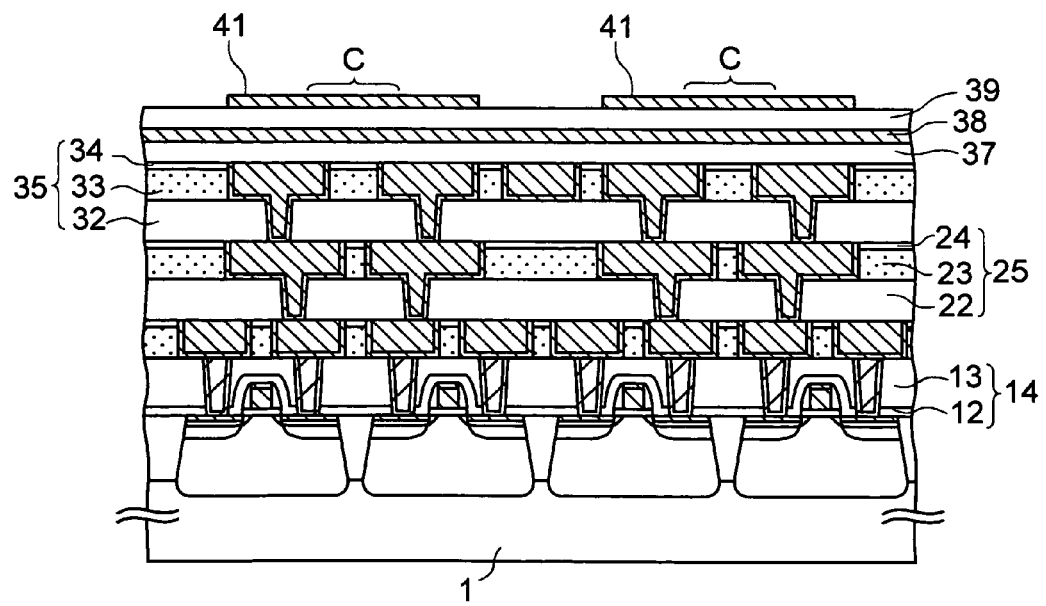
Figure 1N:
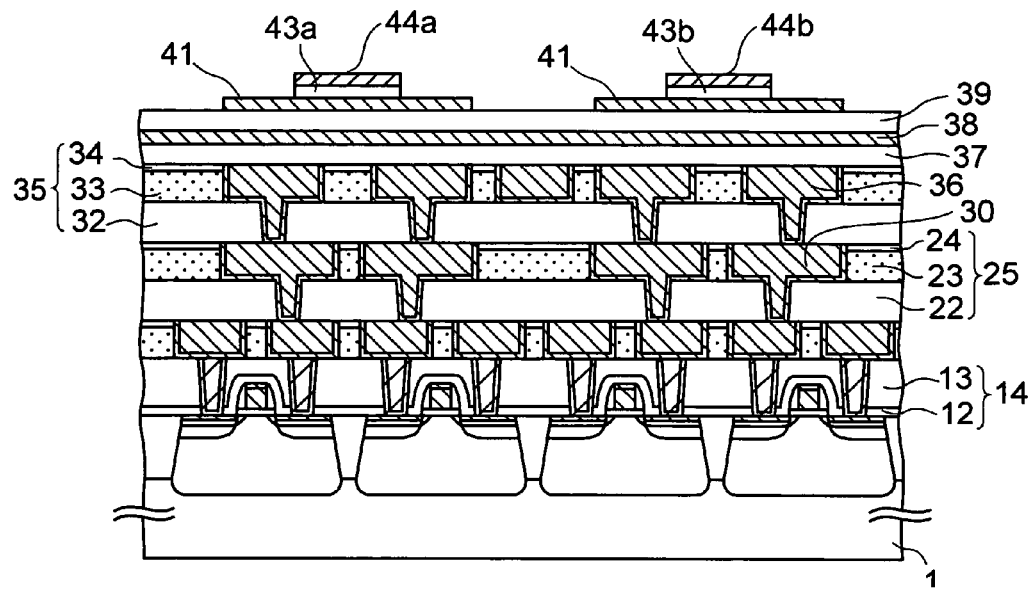
Figure 1O:
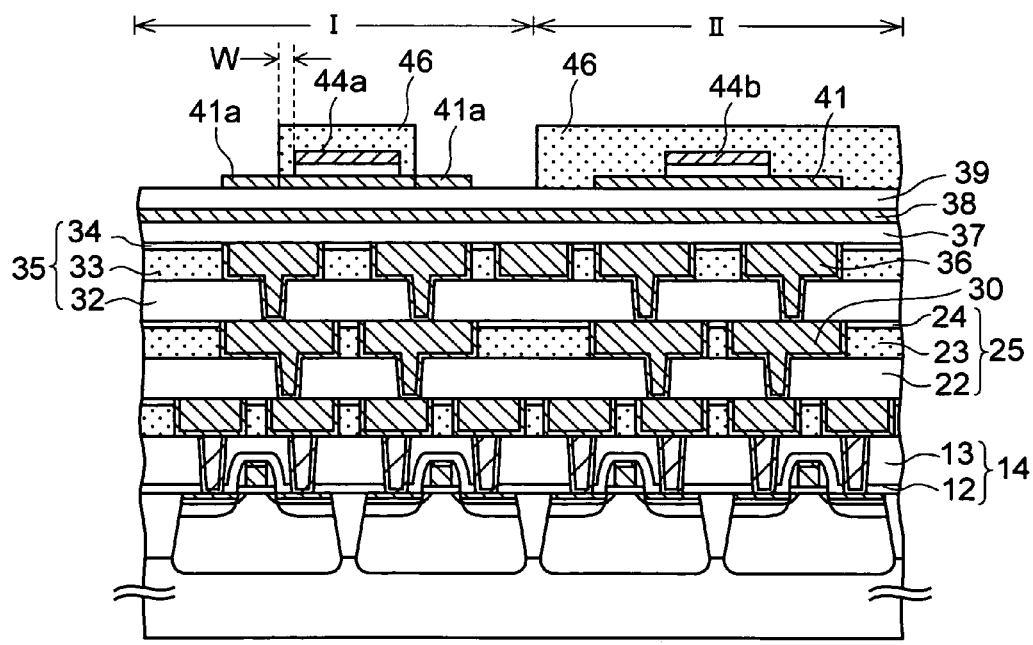
Figure 1P:
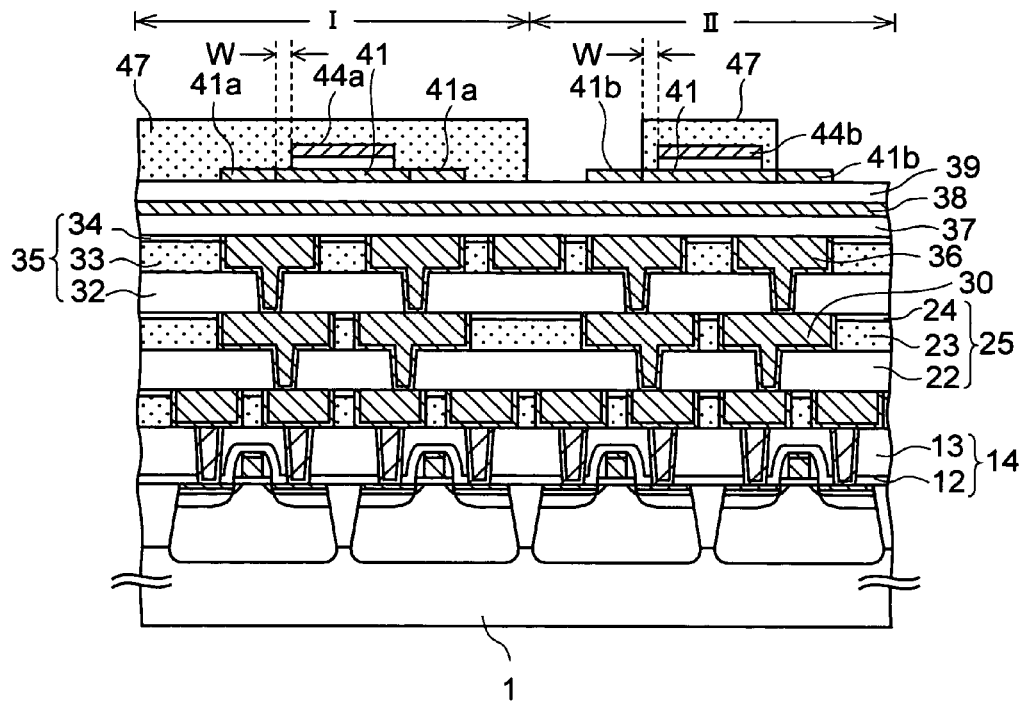
Figure 1Q:
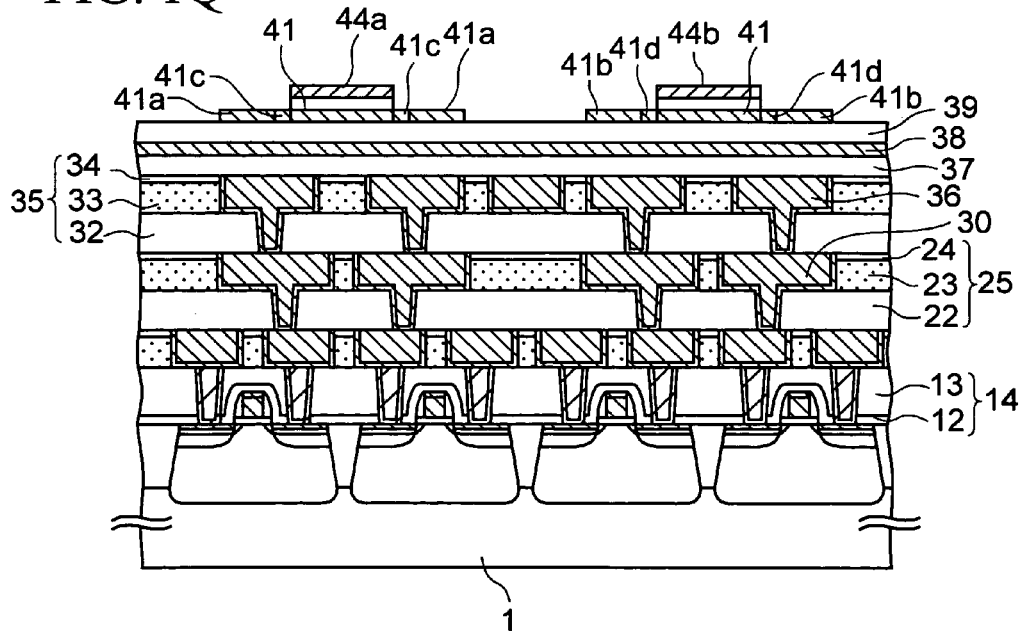
Figure 1R:
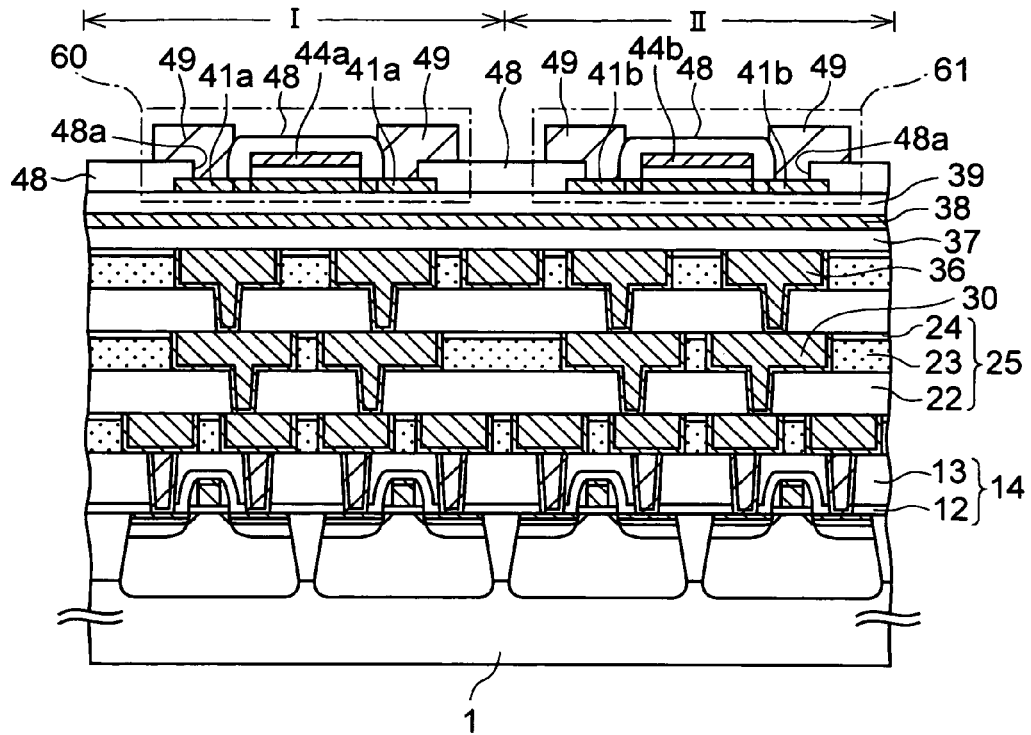
Figure 1S:
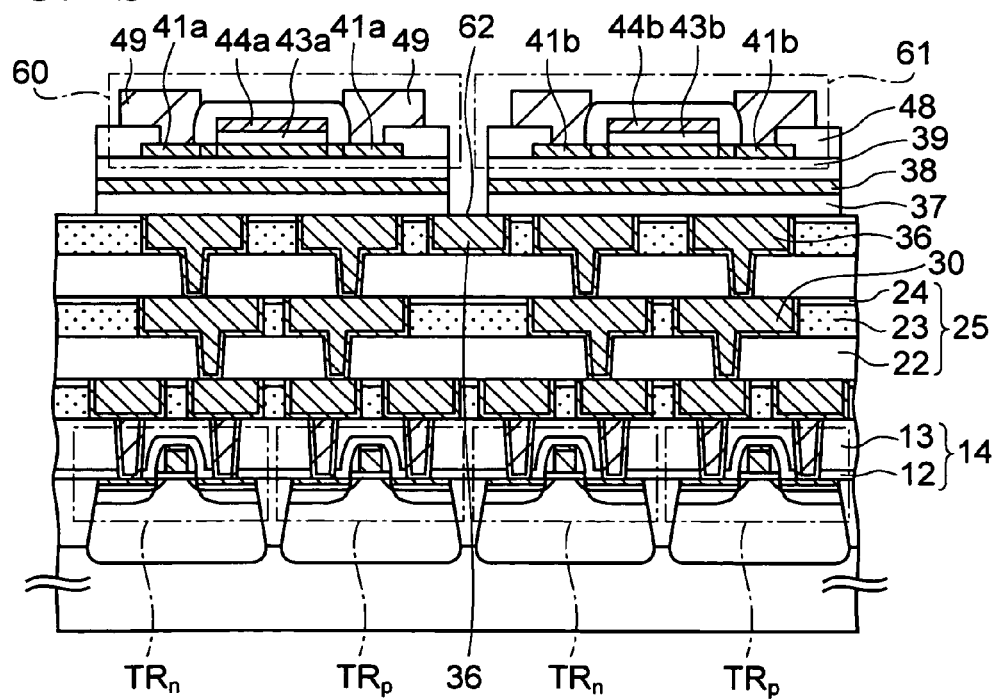

FIGS. 1A to 1S are cross-sectional views in the middle of manufacturing a semiconductor device according to a first embodiment of the present invention First, description will be given of a step of obtaining a cross-sectional structure shown in FIG. 1A.

First, trenches for STI (shallow trench isolation) are formed in a silicon (semiconductor) substrate 1, and a silicon oxide film is buried in the trenches to obtain element isolation insulating films 4. Note that an element isolation structure is not limited to the STI but may be LOCOS (local oxidation of silicon). Thereafter, ion implantation of p-type impurities and n-type impurities is performed in transistor formation regions defined by the element isolation insulating films 4, thereby forming p wells 2 and n wells 3 in the silicon substrate 1.

Furthermore, after a silicon oxide film to be a gate insulating film 7 is formed by thermally oxidizing a surface of the silicon substrate 1, a gate electrode 9 made of polysilicon is formed thereon. Thereafter, while using the gate electrode 9 as a mask, ion implantation of the n-type and p-type impurities is performed in the silicon substrate 1, and n-type source and drain extensions 6a and p-type source and drain extensions 6b are formed in the silicon substrate 1 beside each gate electrode 9. Note that, in the ion implantation described above, an unillustrated resist pattern is used to inject the two types of impurities separately.

Next, an insulating film such as a silicon oxide film is formed on the entire surface, and the insulating film is etched back to be left as an insulation sidewall 8 beside each gate electrode 9. Thereafter, by performing ion implantation using the insulation sidewall 8 and the gate electrode 9 as a mask, n-type source and drain regions 5a and p-type source and drain regions 5b are formed in the silicon substrate 1 beside the gate electrode 9. Subsequently, after a cobalt film is formed on the entire surface by use of a sputtering method, the silicon substrate 1 is subjected to heat treatment to react cobalt with silicon. Accordingly, a cobalt silicide layer 10 is formed on each of the source and drain regions 5a and 5b. The cobalt silicide layer is also formed on the gate electrode 9. Thus, the gate electrode 9 has a polycide structure.

Through such a CMOS process as described above, basic structures including n-type MOS transistors $TR_n$ and p-type MOS transistors $TR_p$ are completed.

Next, as shown in FIG. 1B, as an etching stopper film 12 covering each of the transistors $TR_n$ and $TR_p$, a silicon nitride film is formed to have a thickness of about 10 nm on the entire surface by use of a CVD (chemical vapor deposition) method. Thereafter, a first silicon oxide film 13 is formed to have a thickness of about 400 nm on the etching stopper film 12 by use of the CVD method, and the first silicon oxide film 13 and the etching stopper film 12 are set to be a first interlayer insulating film 14.

Subsequently, the first interlayer insulating film 14 is patterned by photolithography to form first holes 14a, each having a depth reaching each of the source and drain regions 5a and 5b. The patterning is performed by 2-step etching including etching of the first silicon oxide film 13 and etching of the etching stopper film 12. The etching of the first silicon oxide film 13 is stopped by the etching stopper film 12.

Next, as a glue film, a Ti (titanium) film and a TiN (titanium nitride) film are formed in this order on the entire surface by use of the sputtering method. Thereafter, a W (tungsten) film is formed on the glue film by use of the CVD method, and the first holes 14a are completely filled with the W film. Subsequently, by use of a CMP (chemical mechanical polishing) method, excess glue film and W film which are formed on the first interlayer insulating film 14 are removed. These films are left only in the first holes 14a as first conductive plugs 16.

Thereafter, as shown in FIG. 1C, a coating liquid for a low dielectric constant insulating film of a coating type, such as SiLK (manufactured by the Dow Chemical Company) is spin coated onto the upper surfaces of the first interlayer insulating film 14 and the first conductive plugs 16 respectively. Subsequently, the coating liquid is heated and cured to form a first low dielectric constant insulating film 18 with a thickness of about 200 nm, the film having a dielectric constant as low as about 2.8. Note that the low dielectric constant insulating film in this embodiment means an insulating film having a dielectric constant lower than a dielectric constant (about 4) of a silicon oxide layer.

Furthermore, by use of the CVD method, a silicon oxide film is formed to have a thickness of about 50 nm on the first low dielectric constant insulating film 18, and the silicon oxide film thus formed is set to be a first cover insulating film 19. The first cover insulating film 19 plays a role of preventing upward diffusion of degassing from the first low dielectric constant insulating film 18. Moreover, the first cover insulating film 19 forms a second interlayer insulating film 20 together with the first low dielectric constant insulating film 18.

Next, the second interlayer insulating film 20 is patterned by photolithography to form first wiring grooves 20a. Thereafter, on inner surfaces of the wiring grooves 20a and the upper surface of the second interlayer insulating film 20, a Ta (tantalum) layer is formed to have a thickness of about 15 nm as a barrier metal layer by use of the sputtering method. Moreover, on the barrier metal layer, a Cu (copper) seed layer is formed to have a thickness of about 130 nm by use of the sputtering method.

Next, while using the Cu seed layer as a power supply layer, a copper plated film is formed on the Cu seed layer by electrolytic plating, and the first wiring grooves 20a are completely filled with the copper plated film. Thereafter, excess barrier metal layer, Cu seed layer and copper plated film, which are formed on the upper surface of the second interlayer insulating film 20, are removed by use of the CMP method. These films are left only in the first wiring grooves 20a as first copper wirings 21.

Subsequently, as shown in FIG. 1D, on each of the upper surfaces of the first copper wirings 21 and the second interlayer insulating film 20, a second silicon oxide film 22 is formed to have a thickness of about 500 nm by use of the CVD method. Thereafter, a coating liquid for a low dielectric constant insulating film of a coating type, such as SiLK, is spin coated onto the second silicon oxide film 22. The coating liquid is heated and cured to obtain a second low dielectric constant insulating film 23 with a thickness of about 200 nm. Thereafter, on the second low dielectric constant insulating film 23, a silicon oxide film is formed to have a thickness of about 100 nm by use of the CVD method. The silicon oxide film thus formed is set to be a second cover insulating film 24. This second cover insulating film 24 has a function of preventing upward diffusion of degassing from the second low dielectric constant insulating film 23 therebelow. Moreover, the second cover insulating film 24 forms a third interlayer insulating film 25 together with the second low dielectric constant insulating film 23 and the second silicon oxide film 22.

Thereafter, photoresist is applied onto the third interlayer insulating film 25, and the photoresist is exposed and developed. Thus, a first resist pattern 26 including hole-shaped first windows 26a is formed. Thereafter, the third interlayer insulating film 25 is etched through the first windows 26a of the first resist pattern 26. Thus, second holes 25a are formed, each of which has a depth reaching the first copper wiring 21. Although etching gas used in the etching described above is not particularly limited, gas mixture of $CF_4$, $C_4F_8$, $O_2$ and Ar is used as the etching gas in this embodiment.

Thereafter, the first resist pattern 26 is removed by oxygen ashing.

Next, description will be given of a step of obtaining a cross-sectional structure shown in FIG. 1E.

First, photoresist is applied onto the entire surface and is exposed and developed. Thus, a second resist pattern 28 is formed, which includes second windows 28a, each having the shape of a wiring groove, on the second holes 25a. Thereafter, by using the gas mixture of $CF_4$, $C_4F_8$, $O_2$ and Ar as etching gas, the second cover insulating film 24 and the second low dielectric constant insulating film 23 are selectively etched through the second windows 28a. Thus, second wiring grooves 25b connected to the second holes 25a are formed.

Thereafter, the second resist pattern 28 is removed.

Next, as shown in FIG. 1F, by use of the same step as that of forming the first copper wirings 21, second copper wirings 30 are formed in the second holes 25a and the second wiring grooves 25b. A portion of each of the second copper wirings 30, the portion being formed in the second hole 25a, functions as a copper plug 30a electrically connected to the first copper wiring 21.

Next, as shown in FIG. 1G, a fourth interlayer insulating film 35 is formed on the third interlayer insulating film 25. The fourth interlayer insulating film 35 is formed by use of the same step as that of the third interlayer insulating film 25, and includes a third silicon oxide film 32, a third cover insulating film 34 and a third low dielectric constant insulating film 33 such as SiLK. Note that the third cover insulating film 34 is made of a silicon oxide film as in the case of the first and second cover insulating films 19 and 24.

Furthermore, by use of the same step as that of the first and second copper wirings 21 and 30, third copper wirings 36 are buried in the fourth interlayer insulating film 35 described above.

Thereafter, by use of a plasma CVD method using vaporized TEOS as reactive gas, a silicon oxide film is formed to have a thickness of about 300 nm, which is set to be a first insulating film 37.

Next, as shown in FIG. 1H, by use of a sputtering method in which a substrate temperature is set to about 300° C., a metal film such as an Al (aluminum) film is formed to have a thickness of about 200 nm on the entire surface of the first insulating film 37. The metal film thus formed is set to be a shielding film 38. Note that, when the metal film is formed as the shielding film 38, the metal film is not limited to the aluminum film. A metal film made of an element of Al, Au, Ag, Pt, Cu, Mo, Ta, Ti or W, or made of an alloy thereof may be formed as the shielding film 38. Note that metal materials are not limited to those described above.

Next, as shown in FIG. 1I, by use of the plasma CVD method, a silicon oxide film is formed to have a thickness of about 300 nm as a second insulating film 39 on the shielding film 38. In the plasma CVD method, the vaporized TEOS, for example, is used as reactive gas.

Subsequently, as shown in FIG. 1J, while maintaining the temperature of the silicon substrate 1 at about 350° C., an amorphous silicon film is formed to have a thickness of about 50 nm on the second insulating film 39 by use of a Cat-CVD (catalytic CVD) method using gas mixture of hydrogen and silane based gas, such as silane and disilane, as reactive gas. The amorphous silicon film is set to be an amorphous semiconductor film 40. In the Cat-CVD method, the reactive gas is brought into contact with a heated catalyst to decompose the reactive gas, and decomposition seeds thus produced are transported to the substrate maintained at a relatively low temperature (about 350° C.) to form a film. Thus, it is possible to prevent the first to third low dielectric constant insulating films 18, 23 and 33 with low heat resistance from being deteriorated by heat. In addition, it is possible to prevent occurrence of regrowth of a copper crystal due to heat in the first to third copper wirings 21, 30 and 36, and hence the risk of short-circuit between the upper and lower copper wirings can be reduced.

Note that the method for forming the amorphous semiconductor film 40 is not limited to that described above. A LPCVD (low pressure CVD) method, a PECVD (plasma enhanced CVD) method, an optical CVD method or a CVD method using mercury sensitization may be used to form the amorphous-semiconductor film 40.

Furthermore, the amorphous semiconductor film 40 is not limited to the amorphous silicon film but may be an amorphous film made of a silicon-germanium solid solution (SiGe), an amorphous germanium film or an amorphous compound semiconductor film. Moreover, the semiconductor film is not limited to an amorphous thin film but may be a semiconductor thin film containing crystalline minute grains and needle grains.

Thereafter, into each of an n-type TFT (thin film transistor) formation region I and a p-type TFT formation region II, ion implantation of impurities for controlling threshold voltages of these TFTs is performed. Although conditions for the ion implantation are not particularly limited, the substrate temperature is set to 100° C. or lower and a dose is set to $2 \times 10^{12}$ cm$^{-2}$ in this embodiment. Moreover, boron (B) is adopted as n-type impurities injected into the n-type TFT formation region I, and phosphorus (P) is adopted as p-type impurities injected into the p-type TFT formation region II.

Meanwhile, in the amorphous semiconductor film 40, TFT channels to be described later are formed. However, because of very small mobility of the amorphous semiconductor film 40 made of amorphous silicon, drive capacities of the above-described TFTs are inevitably lowered to the extent that the TFTs cannot be put to practical use.

Accordingly, in the next step, as shown in FIG. 1K, an energy beam 42 such as a laser is irradiated onto the amorphous semiconductor film 40, and amorphous silicon constructing the amorphous semiconductor film 40 is melted to be converted into polysilicon. Thus, a polycrystalline semiconductor film 41 made of the polysilicon is formed.

Although the energy beam 42 is not particularly limited, a second harmonic (wavelength: 532 nm) of an Nd:YV04 laser that is a type of a semiconductor excitation solid-state pulsed laser is used in this embodiment. In addition, an energy density of the laser is set to about 580 mJ/cm$^2$. This Nd:YV04 laser has an optical noise smaller than 0.1 rms % within a range of 10 Hz to 2 MHz, the optical noise giving an indication of instability. In addition, since output time instability of the laser is ±1%/hour, a very stable output can be obtained.

Note that the wavelength of the laser beam is not particularly limited as long as the wavelength is within a range of 200 to 1200 nm, within which the amorphous semiconductor film 40 absorbs the laser beam and the amorphous silicon is melted. A fundamental harmonic (wavelength: 1064 nm) or a third harmonic (wavelength: 354 nm) of the Nd:YV04 laser may be used.

Moreover, other than the semiconductor excitation solid-state laser, a pulse oscillating gas laser such as XeCl, ArF and KrF can also be adopted as the laser. Furthermore, a manner of the oscillation of the laser beam is not limited. Either continuous oscillation or pulsed oscillation may be used.

Note that, other than the laser, an electron beam can also be used as the energy beam 42.

Incidentally, such an energy beam 42 easily penetrates the thin amorphous semiconductor film 40. Thus, if there is not the shielding film 38, the third copper wirings 36 and the third low dielectric constant insulating film 33 can be damaged by the energy beam 42.

Figure 2:
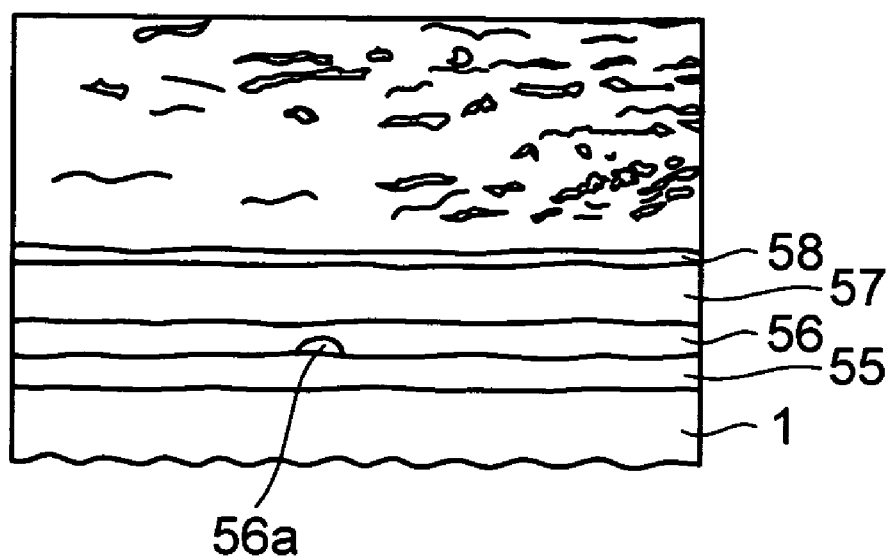
FIG. 2 is a drawing based on a SEM image of a sample used when an influence of irradiation of an energy beam on wirings if no shielding film is formed.

Accordingly, the inventors of the present application have investigated how the irradiation of the energy beam affects the wirings if the shielding film 38 is not formed. FIG. 2 is a drawing based on a SEM cross-sectional image of a sample used in this investigation.

The sample is obtained by sequentially forming a first silicon oxide film 55, an aluminum wiring film 56, a second silicon oxide film 57 and an amorphous silicon film 58 on the silicon substrate 1. As the energy beam 42, the same laser as that used in this embodiment is irradiated onto the uppermost amorphous silicon film 58 to be melted.

As a result, as shown in FIG. 2, damage 56a is caused in the aluminum wiring film 56 by laser irradiation. Thus, it is confirmed that, if the shielding film 38 is not formed, aluminum wirings are actually damaged by the laser.

On the other hand, in this embodiment, the shielding film 38 formed on the entire surface of the first insulating film 37 surely reflects or absorbs the energy beam 42. Thus, direct contact of the energy beam with the third copper wirings 36 and the third low dielectric constant insulating film 33 is prevented. Consequently, deterioration of the wirings 36 and the insulating film 33 due to heat can be prevented.

Note that, even if the energy beam 42 is blocked by the shielding film 38, a heat capacity of the amorphous semiconductor film 40 increases if a film thickness thereof is too large. Therefore, heat generated by irradiation of the energy beam 42 is likely to be accumulated in the amorphous semiconductor film 40. Accordingly, the third copper wirings 36 and the third low dielectric constant insulating film 33 can be damaged by the heat accumulated in the amorphous semiconductor film 40 even if the energy beam 42 is not directly irradiated thereto.

If there is such a concern as described above, it is preferable that the heat capacity of the amorphous semiconductor film 40 is reduced by forming the film to be as thin as possible, for example, 150 nm or less, more preferably, about 50 nm. According to this, the heat is not easily accumulated in the amorphous semiconductor film 40. Thus, the deterioration of the wirings 36 and the insulating film 33 due to the heat can be more effectively prevented.

Moreover, if the thickness of the amorphous semiconductor film 40 is set as thin as about 50 nm as described above, the TFT channels to be formed later are formed in a total depth of the polycrystalline semiconductor film 41. Thus, complete depletion type TFTs can be obtained.

Furthermore, in the above-described irradiation of the energy beam 42, if a large amount of hydrogen is contained in the amorphous semiconductor film 40, the hydrogen is expanded in the film by the energy beam 42. Thus, a film property of the polycrystalline semiconductor film 41 may be deteriorated.

Such a drawback is eliminated by, for example, heat treating the amorphous semiconductor film 40 in a nitrogen atmosphere in advance and setting a concentration of hydrogen contained therein to, for example, 2 atomic % or less. In this case, as heat treatment conditions, for example, a substrate temperature of 400° C. and 30-minute processing time are adopted.

Figure 3:
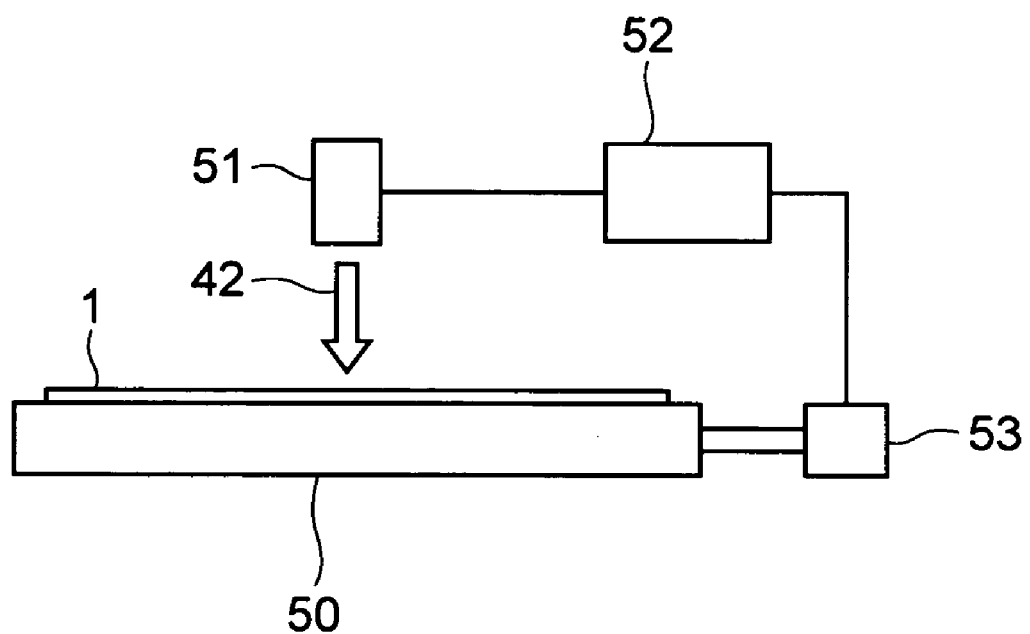
FIG. 3 is a schematic diagram of an apparatus used for scanning of the energy beam on a substrate according to the first embodiment of the present invention.

Moreover, a manner of scanning of the energy beam 42 is not particularly limited. In this embodiment, the beam is scanned by use of an apparatus as shown in FIG. 3. In this apparatus, a stage 50 mounting the silicon substrate 1 thereon can be horizontally moved by a driving unit 53 such as a stepping motor. Moreover, the driving unit 53 and an energy beam generation unit 51 such as a laser generator are controlled by a controller 52.

The driving unit 53 is synchronized with a pulse of a laser irradiated as the energy beam 42. The stage 50 is moved for a predetermined distance at each pulse, and the energy beam 42 is ultimately irradiated onto the entire surface of the amorphous semiconductor film 40.

In such a case, a planar size of the laser irradiated as the energy beam 42 is shaped into a rectangular shape of, for example, 30 mm×0.5 mm. A pulse frequency of the laser is, for example, 3 KHz. If such irradiation conditions are adopted, an average movement speed of the stage 50 is set to about 15 mm/sec.

By irradiating the energy beam 42 onto the entire surface of the amorphous semiconductor film 40 in this manner, the polycrystalline semiconductor film 41 is formed on the entire surface of the second insulating film 39 as shown in FIG. 1L.

Note that, instead of the irradiation of the energy beam 42 onto the entire surface of the amorphous semiconductor film 40 as described above, the energy beam 42 may be irradiated onto only a portion of the amorphous semiconductor film 40, which will become the TFT channels later.

Figure 5A:
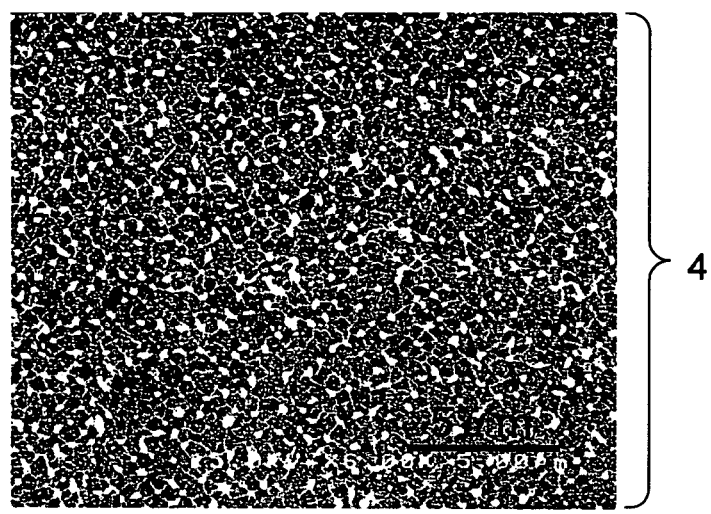
FIG. 5A is a drawing based on a photograph of a polycrystalline semiconductor film 41 formed.
Figure 5B:
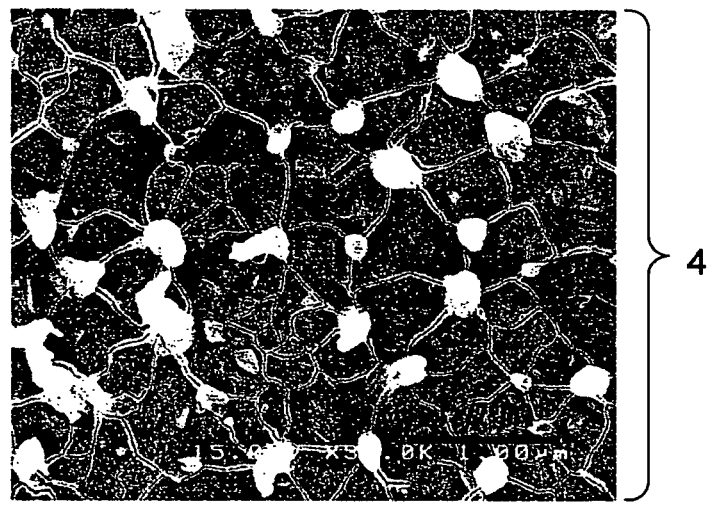
FIG. 5B is a magnified view of FIG. 5A.

FIG. 5A is a photograph of a plan view of the polycrystalline semiconductor film 41 formed as described above. FIG. 5B is a magnified view of FIG. 5A. As shown in FIGS. 5A and 5B, the polycrystalline semiconductor film 41 is formed of polysilicon crystal grains having a grain size of about 300 nm.

Next, as shown in FIG. 1M, by use of photolithography, the polycrystalline semiconductor film 41 is patterned into an island shape including TFT channels C to be formed later.

Next, description will be given of a step of obtaining a cross-sectional structure shown in FIG. 1N.

First, while maintaining the substrate temperature at about 390° C., a silicon oxide film is formed to have a thickness of about 30 nm on the polycrystalline semiconductor film 41 and the second insulating film 39, respectively, by use of the plasma CVD method using the vaporized TEOS as reactive gas. Note that, as a method for forming this silicon oxide film, the LPCVD method or the sputtering method can also be used.

Furthermore, a sputtering method in which the substrate temperature is set to about 200° C. is adopted to form an aluminum film with a thickness of about 300 nm on the silicon oxide film. Thereafter, this aluminum film and the silicon oxide film therebelow are patterned at the same time to form first and second gate electrodes 44a and 44b made of aluminum and first and second gate insulating films 43a and 43b made of the silicon oxide film.

Note that a material to form the first and second gate electrodes 44a and 44b is not limited to aluminum. The gate electrodes may be formed of an alloy obtained by adding copper and the like to aluminum or an alloy of Al—Sc and Al—Nd. Alternatively, a metal laminated film in which a reflection preventing film such as a Ti film is formed may be used as the first and second gate electrodes 44a and 44b.

Furthermore, the first and second gate insulating films 43a and 43b are not limited to the silicon oxide film. As these gate insulating films 43a and 43b, a high dielectric constant film such as an HfON film, a SiN film and a TaO$_2$ film or a laminated film of these insulating films may be adopted.

Subsequently, as shown in FIG. 1O, a third resist pattern 46 covering the first gate electrode 44a with an offset width W is formed on the polycrystalline semiconductor film 41. By use of this third resist pattern 46 as a mask, while maintaining the substrate temperature at 100° C. or lower, ion implantation of n-type impurities, P (phosphorus), is performed with an acceleration energy of 10 keV and a dose of 2×10$^{15}$ cm$^{-2}$ for the polycrystalline semiconductor film 41 in the n-type TFT formation region I. Thus, in portions of the polycrystalline semiconductor film 41 which are not covered with the third resist pattern 46 in the n-type TFT formation region I, n-type source and drain regions 41a are formed.

Note that the above-described impurities are not injected into the polycrystalline semiconductor film 41 covered with the third resist pattern 46 in the p-type TFT formation region II.

Thereafter, the third resist pattern 46 is removed.

Subsequently, as shown in FIG. 1P, a fourth resist pattern 47 covering the second gate electrode 44b with the offset width W is formed on the polycrystalline semiconductor film 41. By use of this fourth resist pattern 47 as a mask, ion implantation of p-type impurities, boron (B), is performed for the polycrystalline semiconductor film 41 in the p-type TFT formation region II. Thus, p-type source and drain regions 41b are formed beside the second gate electrode 44b. Note that conditions for this ion implantation are not particularly limited. In this embodiment, an acceleration energy of 10 keV, a dose of 2×10$^{15}$ cm$^{-2}$ and a substrate temperature of 100° C. are adopted.

After the ion implantation described above is finished, the fourth resist pattern 47 is removed.

Each of the source and drain regions 41a and 41b formed as described above are separated from the first and second gate electrodes 44a and 44b by the same width as the offset width W of the third and fourth resist patterns 46 and 47. The offset width W makes it possible to ease field concentration on the source and drain regions 41a and 41b.

Next, as shown in FIG. 1Q, by use of the first gate electrode 44a as a mask, ion implantation of the n-type impurities, phosphorus (P), is performed for the polycrystalline semiconductor film 41. Thus, n-type source and drain extensions 41c are formed so as to self-align with the first gate electrode 44a. Similarly, ion implantation of the p-type impurities, boron (B), is performed for the polycrystalline semiconductor film 41 in the p-type TFT formation region II. Thus, p-type source and drain extensions 41d are formed so as to self-align with the second gate electrode 44b. Note that an unillustrated resist pattern is used to inject the n-type impurities and the p-type impurities separately as described above. The resist pattern is removed by oxygen ashing after the ion implantation is finished.

The source and drain extensions 41c and 41d described above form a LDD (lightly doped drain) structure together with the source and drain regions 41a and 41b. Note that, if it is desired to further prevent the field concentration on the source and drain regions 41a and 41b, the source and drain extensions 41c and 41d may be omitted. In such a case, the polycrystalline semiconductor film 41 in the width W equivalent to the extensions 41c and 41d is left as non-doped. As described above, the structure in which the source and drain regions 41a and 41b are separated from the gate electrodes 44a and 44b by the non-doped polycrystalline semiconductor film 41 having the width W is called an offset gate structure.

Thereafter, the irradiation of the energy beam 42, which has been described in FIG. 1K, is performed again to activate the impurities in each of the source and drain regions 41a and 41b. Note that the energy density of the energy beam 42 does not have to be as strong as to melt amorphous silicon as in the case of FIG. 1K, but may be half (about 300 mJ/cm$^2$) of the energy density in the step of FIG. 1K.

Moreover, this irradiation of the energy beam 42 is performed while moving the silicon substrate 1 by use of such an apparatus as described in FIG. 3. Thus, each of the source and drain regions 41a and 41b are heated by the energy beam 42 for an extremely short time. Consequently, the third copper wirings 36 and the third low dielectric constant insulating film 33 are never excessively heated in activation of the impurities described above.

Note that, instead of such irradiation of the energy beam, the impurities may be activated by thermal activation, RTA (rapid thermal anneal), flash heat treatment or the like. Among those described above, the thermal activation is performed by use of a furnace, and the flash heat treatment is performed by use of radiant heat of a lamp.

Next, description will be given of a step of obtaining a cross-sectional structure shown in FIG. 1R.

First, a silicon oxide film is formed to have a thickness of about 300 nm on the entire surface by use of the plasma CVD method in which the substrate temperature is set to 350° C. or lower. The silicon oxide film thus formed is set to be a third insulating film 48. Thereafter, this third insulating film 48 is patterned by use of photolithography to form first and second contact holes 48a and 48b, each having a depth reaching each of the source and drain regions 41a and 41b.

Subsequently, a metal laminated film including a Ti film, an Al film and a Ti film is formed on the entire surface by use of the sputtering method and is patterned. Thus, electrodes 49 are obtained, which are electrically connected to each of the source and drain regions 41a and 41b through the first and second contact holes 48a and 48b. Each of the electrodes 49 includes the Ti film formed in its bottom layer, the Ti film having a small difference from polysilicon in a work function with polysilicon. Thus, carriers are smoothly injected into each of the source and drain regions 41a and 41b from the electrodes 49.

Thereafter, the electrodes 49 are sintered in an atmosphere in which several % of hydrogen is added to inert gas such as $N_2$ and Ar. Accordingly, a contact resistance between the electrodes 49 and the source and drain regions 41a and 41b is reduced.

Through the steps so far, the basic structures of an n-type TFT 60 and a p-type TFT 61 are completed in each of the regions I and II. In this embodiment, the first and second gate electrodes 44a and 44b included in the TFTs 60 and 61 are made of the same material (aluminum). Thus, the steps can be simplified and manufacturing costs can be reduced.

Subsequently, as shown in FIG. 1S, the first insulating film 37, the shielding film 38, the second insulating film 39 and the third insulating film 48 are patterned. Thus, a third hole 62 having a depth reaching the third copper wiring 36 is formed. Although, thereafter, a step of forming a conductive plug in this third hole 62 is performed, the conductive plug being electrically connected to the third copper wiring 36, details thereof will be omitted.

Accordingly, the basic structure of a stacked semiconductor device including the TFTs 60 and 61 formed above the MOS transistors $TR_n$ and $TR_p$ is completed. Each function of the MOS transistors $TR_n$ and $TR_p$ and the TFTs 60 and 61 are not limited. However, it is preferable that this stacked semiconductor device is set to be a SOC (System on Chip) by allowing the MOS transistors $TR_n$ and $TR_p$ and the TFTs 60 and 61 to have different functions. In such a case, since the MOS transistors $TR_n$ and $TR_p$ and the TFTs 60 and 61 have the functions different from each other, there is no need to electrically connect these two types of transistors with each other.

Moreover, the shielding film 38 formed of a metal film is not connected to other elements, and is set to be in an electrically floating state.

According to this embodiment described above, before the irradiation of the energy beam 42 onto the amorphous semiconductor film 40 in the step of FIG. 1K, the shielding film 38 is formed below the amorphous semiconductor film 40 in advance. Thus, the third low dielectric constant insulating film 33 and the third copper wirings 36 are never directly exposed to the energy beam 42 and heated thereby. Accordingly, the third low dielectric constant insulating film 33 with low heat resistance is prevented from being deteriorated by heat. Thus, while maintaining a low dielectric constant characteristic of the insulating film 33, the amorphous semiconductor film 40 is converted into the polycrystalline semiconductor film 41, and mobility of channels of the TFTs 60 and 61 (see FIG. 1R) can be improved.

Furthermore, the third copper wirings 36 are not directly heated by the energy beam 42, either. Thus, copper crystals in the third copper wirings 36 are unlikely to be regrown in a needle shape by heat. Thus, needle-shaped copper crystals can be prevented from reaching the second copper wirings 30 by penetrating the third silicon oxide film 32 therebelow. As such, insulation properties between the second and third copper wirings 30 and 36 can be favorably maintained. Moreover, disconnection can also be prevented.

Such advantages as described above can be obtained not only by the third low dielectric constant insulating film 33 and the third copper wirings 36 but also by the first and second low dielectric constant insulating films 18 and 23 and the first and second copper wirings 21 and 30 therebelow.

Consequently, according to this embodiment, it is possible to provide the stacked semiconductor device including the MOS transistors $TR_n$ and $TR_p$ and the TFTs 60 and 61, which are stacked, while preventing the copper wirings and the insulating films therebetween from being thermally damaged.

Moreover, the shielding film 38 described above also functions also as a reinforcing film which reinforces mechanical strength of the stacked semiconductor device. Thus, a mechanical damage caused in the step of forming the TFTs 60 and 61 is hardly passed down below the shielding film 38. As a result, damages inflicted on the first to third low dielectric constant insulating films 18, 23 and 33, the first to third copper wirings 21, 30 and 36, and the MOS transistors $TR_n$ and $TR_p$ during the process are reduced. Thus, occurrence of defects in these films and transistors can be prevented.

Figure 4A:
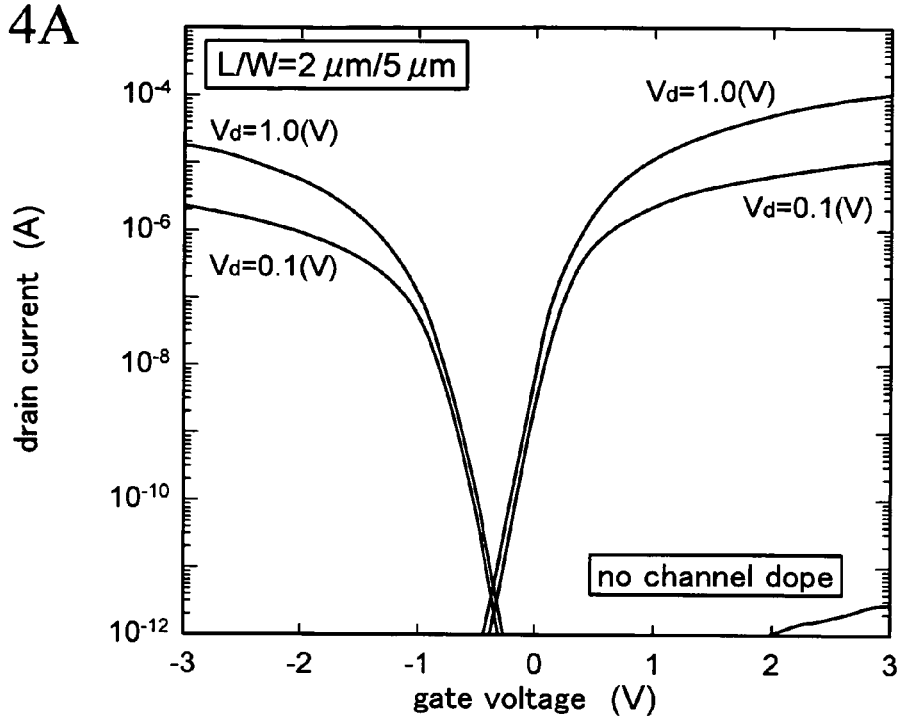
FIGS. 4A and 4B are graphs obtained by investigating device characteristics of TFTs fabricated in the first embodiment of the present invention.
Figure 4B:
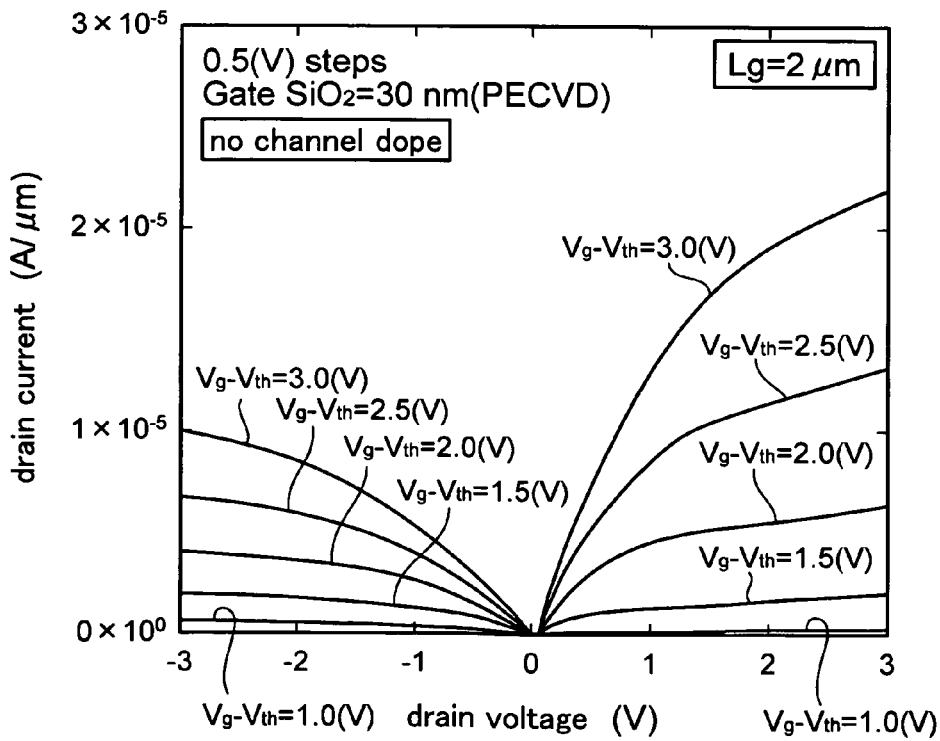

FIGS. 4A and 4B are graphs obtained by investigating device performance of the n-type and p-type TFTs 60 and 61 fabricated as described above. Note that, in the investigation, impurities for controlling a threshold voltage are not injected into the polycrystalline semiconductor film 41 to be channels of the TFTs 60 and 61.

FIG. 4A is a graph showing a relationship between a gate voltage and a drain current in each of the cases where a drain voltage Vd is 1.0V and where the drain voltage Vd is 0.1V. Particularly, FIG. 4A is a graph in the case where a gate width is set to 5 μm and a gate length is set to 2 μm. A gate oxide film has a thickness of 30 nm.

Meanwhile, FIG. 4B is a graph showing a relationship between a drain voltage and a drain current, and particularly a graph in the case where a thickness of the gate insulating film 43a is set to 30 nm and a gate length is set to 2 μm. Note that, in this investigation, a difference (Vg-Vth) between the gate voltage (Vg) and the threshold voltage (Vth) is sequentially changed by 0.5V.

As is understood from FIGS. 4A and 4B, there is no major problem with characteristics of the TFTs 60 and 61 fabricated as described above. The TFTs 60 and 61 having characteristics good enough to be put into practical use are obtained.

(2) Second Embodiment

In the first embodiment, the metal film such as the Al film is formed as a shielding film 38 in the step of FIG. 1H. On the contrary, in this embodiment, a reflecting film is formed as the shielding film 38 in the following manner.

Figure 6A:
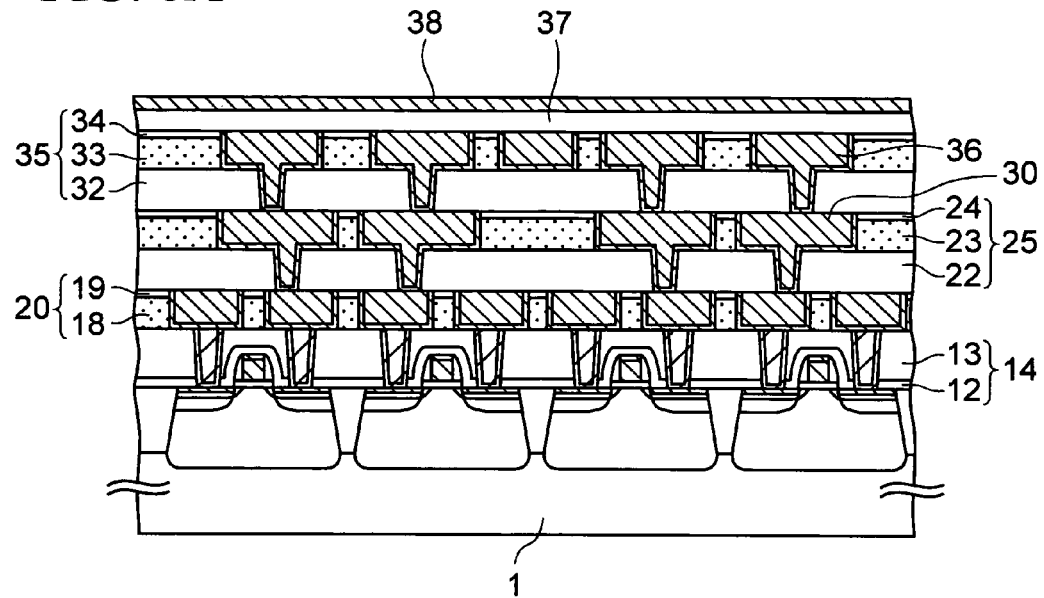
FIGS. 6A and 6B are cross-sectional views in the middle of manufacturing a semiconductor device according to a second embodiment of the present invention.
Figure 6B:
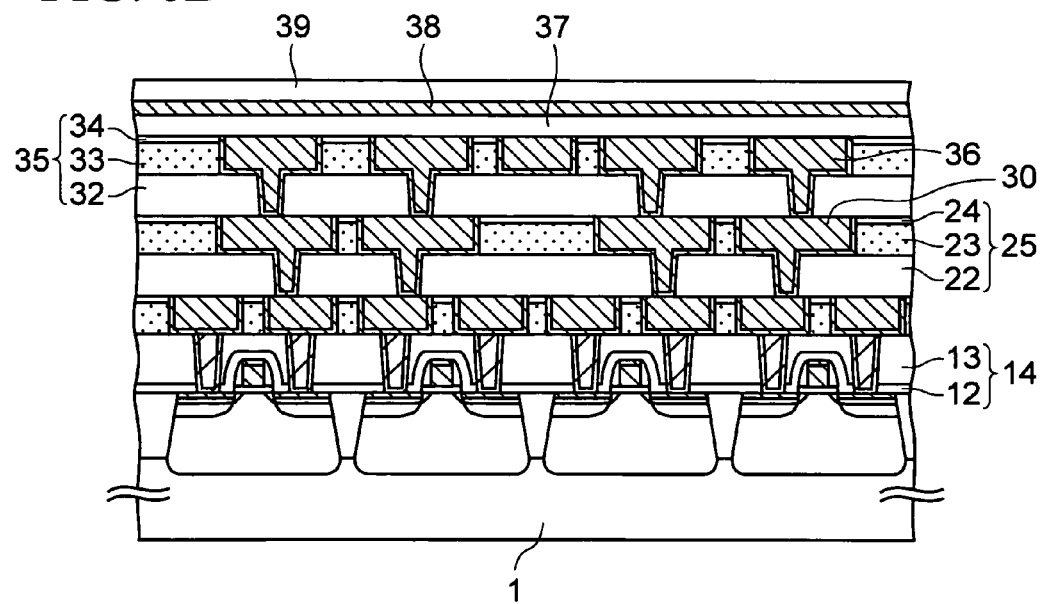

FIGS. 6A and 6B are cross-sectional views in the middle of manufacturing a semiconductor device according to this embodiment. Note that, in FIGS. 6A and 6B, the components described in the first embodiment are denoted by the same reference numerals as those in the first embodiment, and description thereof will be omitted below.

First, description will be given of a step of obtaining a cross-sectional structure shown in FIG. 6A.

First, after the structure of FIG. 1G has been obtained according to the first embodiment, a reflecting film is formed to have a thickness of about 50 to 500 nm as shown in FIG. 6A, the reflecting film being obtained by sequentially laminating a nitride film (SiN film) and an oxide film ($SiO_2$ film) by use of the plasma CVD method. The reflecting film is set to be the shielding film 38. Note that, if such a reflecting film made of a laminated film is formed as the shielding film 38, the film included in the laminated film is not limited to the nitride film. A nitrogen-containing insulating film such as an oxynitride film (SiON film) may be formed as the reflecting film.

Next, as shown in FIG. 6B, by use of the plasma CVD method, a silicon oxide film having a refractive index lower than that of the shielding film 38 is formed to have a thickness of about 300 nm. The silicon oxide film thus formed is set to be a second insulating film 39. Note that the second insulating film 39 is not limited to the silicon oxide film as long as the second insulating film 39 is made of a film having a refractive index lower than those of the respective films of the laminated film which forms the shielding film 38. The second insulating film 39 may be a carbon-containing silicon oxide film (SiOC film).

Thereafter, through the steps of FIGS. 1J and 1K described in the first embodiment, an energy beam 42 is irradiated onto an amorphous semiconductor film 40, and the amorphous semiconductor film 40 is converted into a polycrystalline semiconductor film 41 good enough to be used as TFT channels.

In this event, with regard to the shielding film 38 and the second insulating film 39, the shielding film 38 has a higher refractive index. Thus, comparing to the case where the second insulating film 39 has a higher refractive index, a reflectance of the shielding film 38 is increased. Accordingly, if light such as a laser is used as the energy beam 42, a large part of the energy beam is reflected on the surface of the shielding film 38. Thus, the energy beam 42 is never irradiated directly onto third copper wirings 36 and a third low dielectric constant insulating film 33 below the shielding film 38. Therefore, the third copper wirings 36 and the third low dielectric constant insulating film 33 are not directly heated by the energy beam 42. Thus, it makes it possible to avoid problems such as regrowth of copper crystals of the third copper wirings 36 and deterioration of the low dielectric constant characteristic of the third low dielectric constant insulating film 33.

Subsequently, through the steps of FIGS. 1L to 1S described in the first embodiment, a stacked semiconductor device is completed, which includes MOS transistors $TR_n$ and $TR_p$ and TFTs 60 and 61 as shown in FIG. 1S.

Figure 7A:
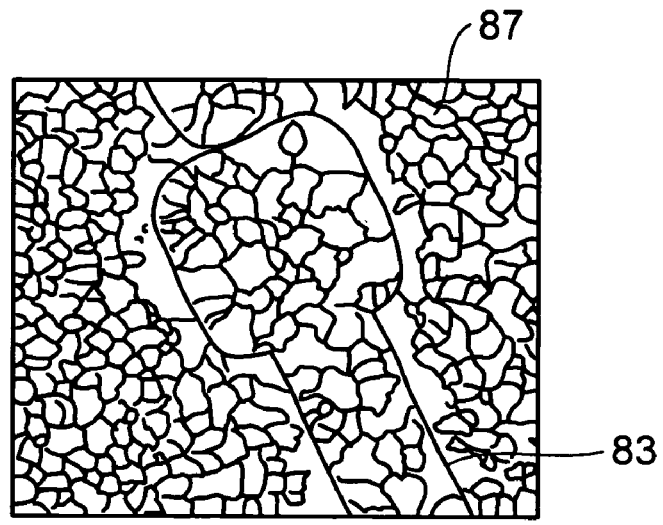
FIG. 7A is a plan view based on a SEM image of a sample used for confirming effects obtained when a reflecting film is formed in the second embodiment of the present invention.
Figure 7B:
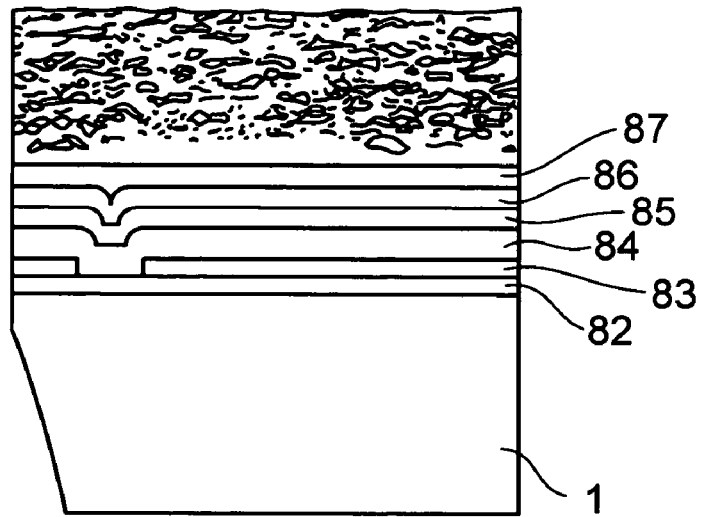
FIG. 7B is a cross-sectional view of FIG. 7A.

FIG. 7A is a plan view based on a SEM image of a sample used for confirming effects obtained when the reflecting film is formed as the shielding film 38 as described above. FIG. 7B is a cross-sectional view of FIG. 7A.

As shown in the cross-sectional view of FIG. 7B, the sample is obtained by sequentially forming a first silicon dioxide film 82, an aluminum wiring film 83, a second silicon dioxide film 84, a reflecting film 85 having a laminated structure including a silicon nitride film and an oxide film, a third silicon dioxide film 86 and a polysilicon film 87 on a semiconductor substrate 1. Among the films described above, the film 85 having the laminated structure including the silicon nitride film and the oxide film functions as a reflecting film and corresponds to the shielding film 38 in this embodiment.

The polysilicon film 87 formed in the uppermost layer of the sample is obtained by melting an amorphous silicon film by use of a laser. However, no wiring defect is caused in the aluminum wiring film 83 below the polysilicon film 87. Consequently, it is understood that the silicon nitride film 85 corresponding to a shielding film reflects the laser and prevents direct irradiation of the laser onto the aluminum wiring film 83.

(3) Third Embodiment

In the first embodiment as already described, TFTs 60 and 61 having the LDD structure and the offset gate structure are fabricated. Meanwhile, in this embodiment, TFTs having a GOLD (gate overlap lightly doped drain) structure are fabricated.

FIGS. 8A to 8F are cross-sectional views in the middle of manufacturing a semiconductor device according to this embodiment. Note that, in FIGS. 8A to 8F, the components described in the first embodiment are denoted by the same reference numerals as those in the first embodiment, and description thereof will be omitted below.

Figure 8A:
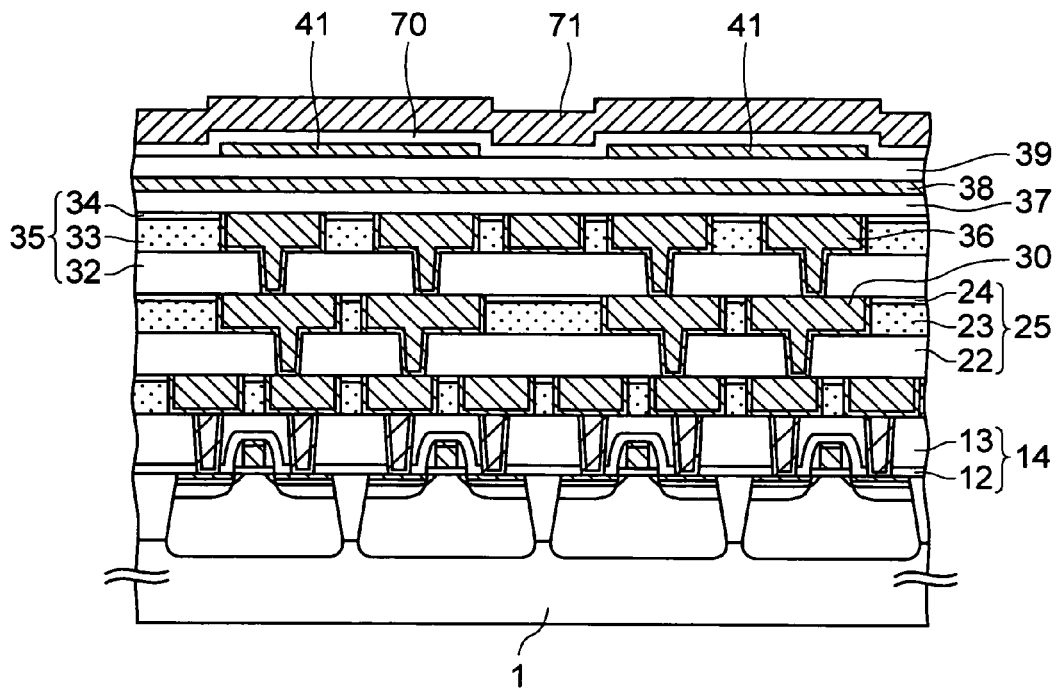
FIGS. 8A to 8F are cross-sectional views in the middle of manufacturing a semiconductor device according to a third embodiment of the present invention.

First, description will be given of a step of obtaining a cross-sectional structure shown in FIG. 8A.

First, after the steps of FIGS. 1A to 1M described in the first embodiment have been performed, a silicon oxide film is formed to have a thickness of about 30 nm on the entire surface by use of a plasma CVD method using vaporized TEOS as reactive gas. The silicon oxide film thus formed is set to be a gate insulating film 70. Thereafter, a sputtering method in which a substrate temperature is set at about 200° C. is adopted to form an aluminum film with a thickness of about 300 nm as a gate electrode conductive film 71 on the gate insulating film 70.

Figure 8B:
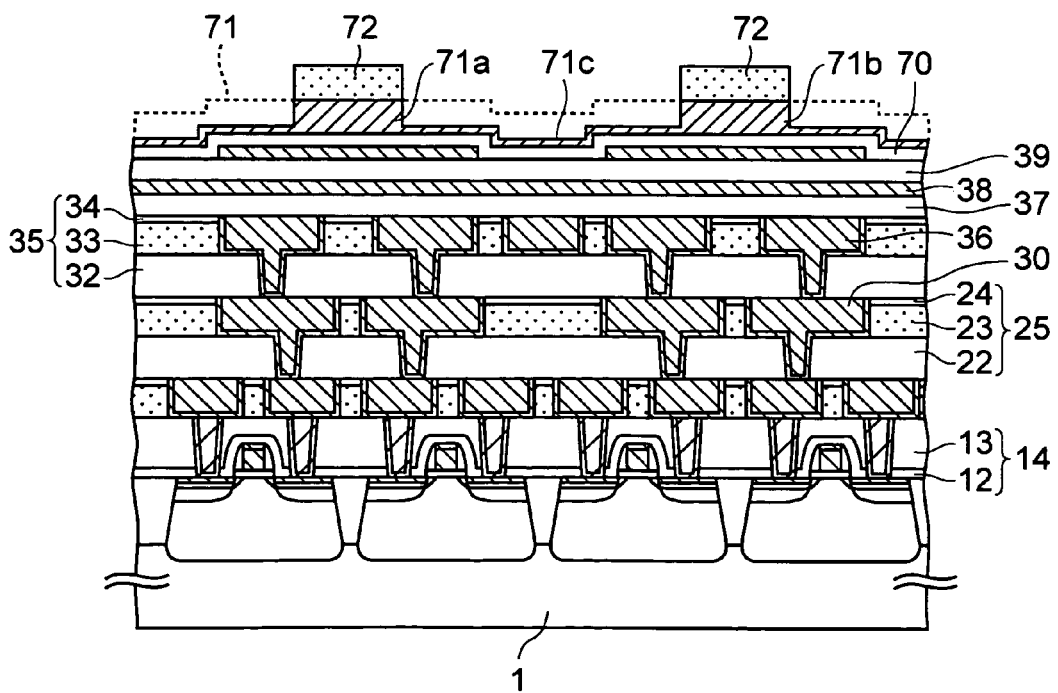

Next, as shown in FIG. 8B, a fifth resist pattern 72 is formed on the gate electrode conductive film 71. Thereafter, by use of this fifth resist pattern 72 as a mask, the gate electrode conductive film 71 is dry etched halfway to form a thin portion 71c having a thickness of about 10 to 100 nm in the gate electrode conductive film 71. Note that the gate electrode conductive film 71 below the fifth resist pattern 72 has its original thickness without being etched, and is set to be first and second gate portions 71a and 71b.

Thereafter, the fifth resist pattern 72 is removed.

Figure 8C:
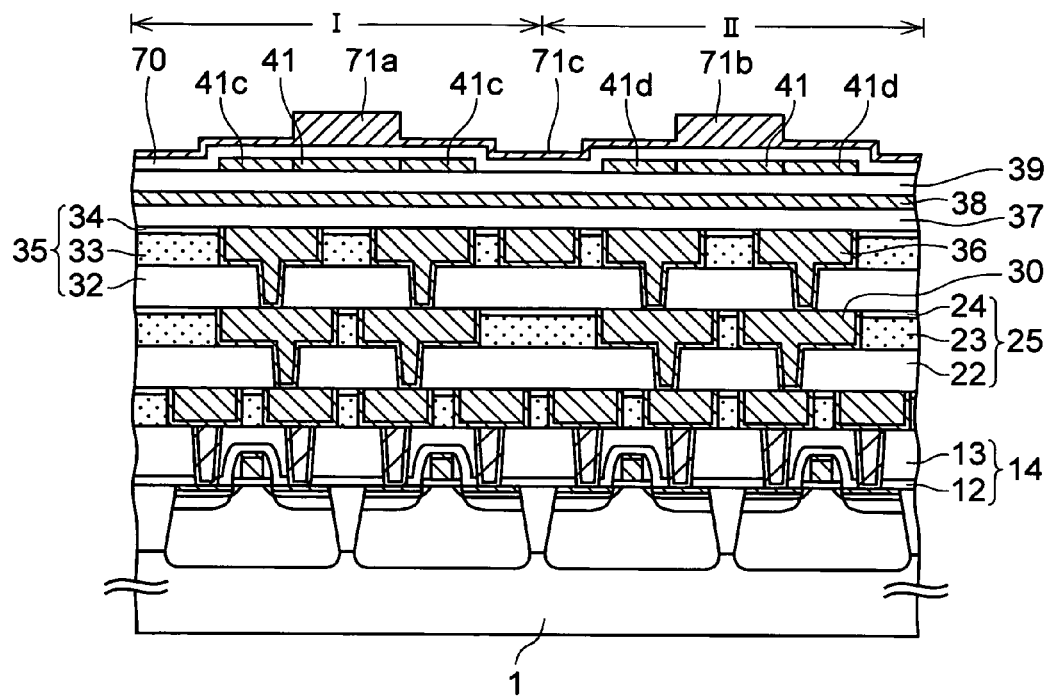

Subsequently, as shown in FIG. 8C, by use of the first gate portion 71a as a mask, ion implantation of n-type impurities, phosphorus (P), is performed for a polycrystalline semiconductor film 41 in an n-type TFT formation region I while using the thin portion 71c and the gate insulating film 70 as a through film. Thus, in the polycrystalline semiconductor film 41 in the n-type TFT formation region I, n-type source and drain extensions 41c are formed so as to self-align with the first gate portion 71a.

Thereafter, by use of a method similar to that described above, ion implantation of p-type impurities, boron (B), is performed for the polycrystalline semiconductor film 41 in a p-type TFT formation region II by using the second gate portion 71b as a mask. Thus, p-type source and drain extensions 41d are formed so as to self-align with the second gate portion 71b.

Note that an unillustrated resist pattern is used to separately inject the n-type impurities and the p-type impurities into the source and drain extensions 41c and 41d described above. The resist pattern is removed after the ion implantation is finished.

Figure 8D:
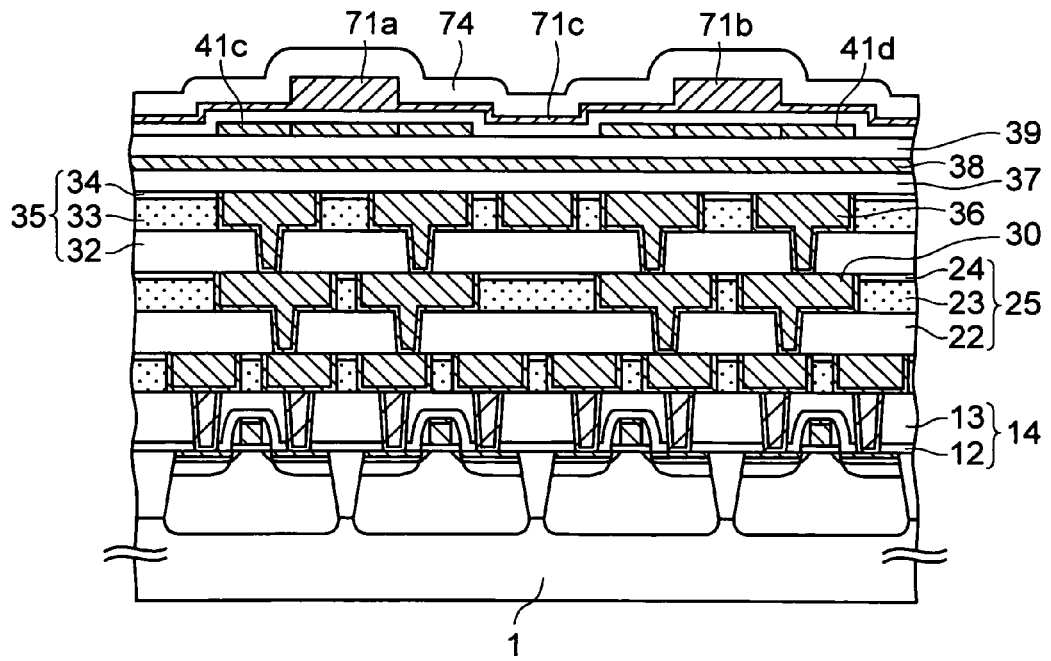

Subsequently, as shown in FIG. 8D, a silicon oxide film is formed to have a thickness of about 300 nm on the entire surface by use of the CVD method. The silicon oxide film thus formed is set to be a sidewall insulating film 74.

Figure 8E:
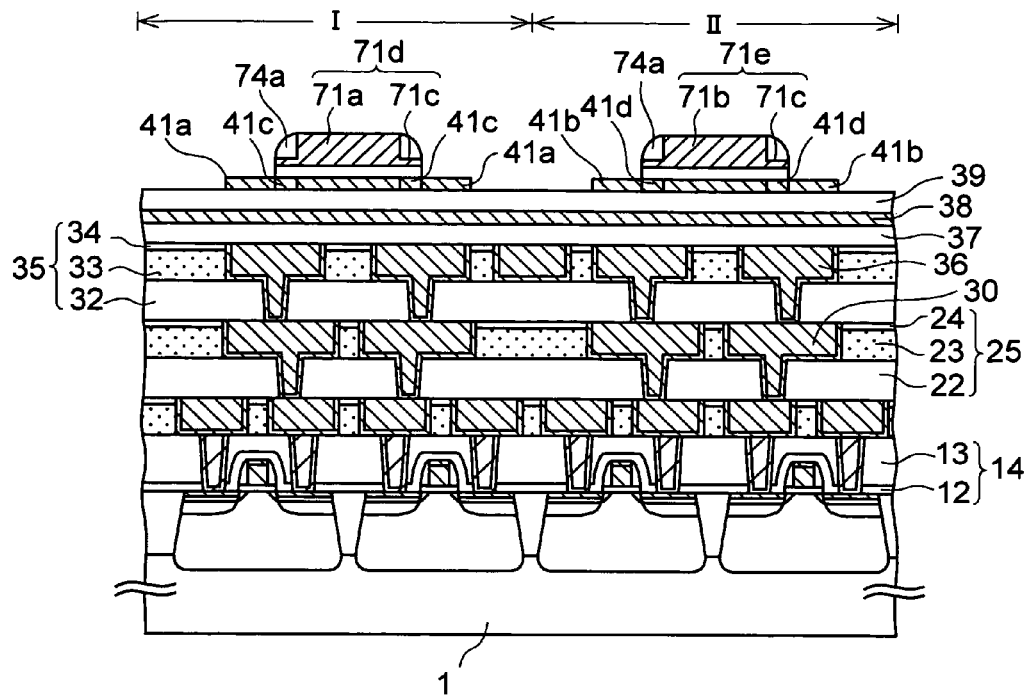

Next, description will be given of a step of obtaining a cross-sectional structure shown in FIG. 8E.

First, the sidewall insulating film 74 is etched back to be left as insulating sidewalls 74a beside the first and second gate portions 71a and 71b. Thereafter, by further etching back the sidewall insulating film 74, the thin portions 71c and the gate insulating film 70 in a portion that is not covered with the insulating sidewalls 74a are etched. Thus, in the n-type TFT formation region I, a first gate electrode 71d is formed, which includes the first gate portion 71a and the thin portion 71c. In the p-type TFT formation region II, a second gate electrode 71e is formed, which includes the second gate portion 71b and the thin portion 71c.

Thereafter, by ion implantation using the first gate electrode 71d and the insulating sidewall 74a as a mask, P is injected into the n-type source and drain extensions 41c under conditions that, for example, an acceleration energy is 10 keV and a dose is $2\times10^{15}$ cm$^{-2}$. Thus, n-type source and drain regions 41a are formed.

Subsequently, by adopting the same conditions as those described above, boron (B) is injected into the p-type source and drain extensions 41d while using the second gate electrode 71e and the insulating sidewall 74a as a mask. Thus, p-type source and drain regions 41b are formed.

Figure 8F:
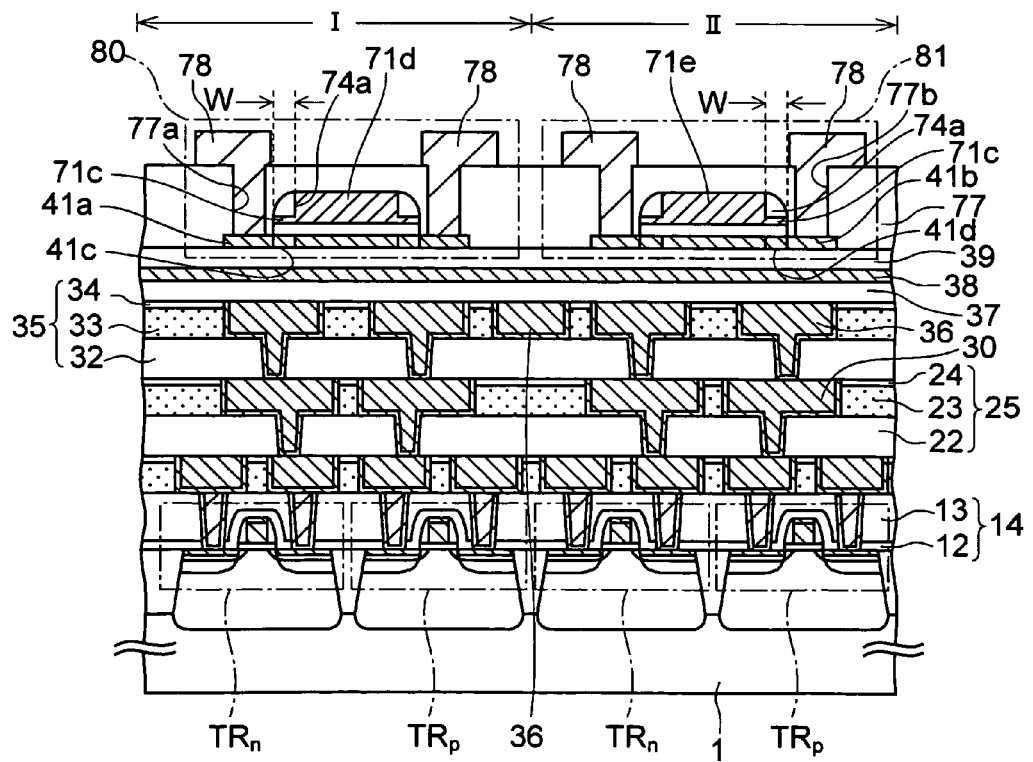

Next, description will be given of a step of obtaining a cross-sectional structure shown in FIG. 8F.

First, by use of the CVD method, a silicon oxide film is formed to have a thickness of about 300 nm on the entire surface as a fourth insulating. film 77.

Thereafter, by use of photolithography, this fourth insulating film 77 is patterned to form first and second contact holes 77a and 77b, each having a depth reaching each of the source and drain regions 41a and 41b.

Subsequently, by use of the sputtering method, a metal laminated film including a Ti film, an Al film and a Ti film is formed on the entire surface and is patterned. Thus, electrodes 78 are obtained, which are electrically connected to each of the source and drain regions 41a and 41b through the first and second contact holes 77a and 77b.

Thereafter, the electrodes 78 are sintered in an atmosphere in which several % of hydrogen is added to inert gas such as N$_2$ and Ar. Accordingly, contact resistance between the electrodes 78 and the source and drain regions 41a and 41b is reduced.

Through the steps so far, basic structures of an n-type TFT 80 and a p-type TFT 81 are completed in each of the regions I and II.

Each of the TFTs 80 and 81 described above has the GOLD structure in which the thin portion 71c of each of the first and second gate electrodes 71d and 71e overlaps each of the source and drain extensions 41c and 41d by a width W of the insulating sidewall 74a. According to the GOLD structure, carrier concentrations of the source and drain extensions 41c and 41d can be controlled by the first and second gate electrodes 71d and 71e. Thus, the impurity concentration of each of the extensions 41c and 41d can be lowered. Such reduction in the impurity concentration makes it possible to more effectively ease the field concentration in the source and drain regions 41a and 41b. In addition, a short channel effect and punch-through can also be suppressed.

Thereafter, the first insulating film 37, the shielding film 38, the second insulating film 39 and the fourth insulating film 77 are patterned to form a hole having a depth reaching the third copper wiring 36. Subsequently, a conductive plug electrically connected to the third copper wiring 36 is formed in the hole. However, details thereof will be omitted.

As described above, the basic structure of a stacked semiconductor device is completed, in which the TFTs 80 and 81 having the GOLD structure are formed above the MOS transistors TR$_n$ and TR$_p$.

According to this embodiment described above, as in the case of the first embodiment, the shielding film 38 is formed below the polycrystalline semiconductor film 41. Thus, in formation of the polycrystalline semiconductor film 41 by irradiation of the energy beam 42 in the step of FIG. 1K, the energy beam 42 is blocked by the shielding film 38. Accordingly, the third copper wirings 36 and the third low dielectric constant insulating film 33 are prevented from being directly heated by the energy beam. As a result, as described in the first embodiment, it is possible to obtain the stacked semiconductor device in which the MOS transistors and the TFTs are stacked while preventing deterioration of the third low dielectric constant insulating film 33 by heat and preventing regrowth of the copper crystals of the third copper wirings 36 due to heat.

Furthermore, in this embodiment, TFTs having the GOLD structure are adopted as the TFTs 80 and 81. Thus, the field concentration in the source and drain regions 41a and 41b can be effectively eased, and the short channel effect and the punch-through can be suppressed.

According to the present invention, by use of the shielding film which reflects or attenuates the energy beam used for converting the amorphous semiconductor film into the polycrystalline semiconductor film, direct irradiation of the energy beam onto the interlayer insulating films and the wirings can be prevented. In addition, deterioration of the interlayer insulating films and the wirings by heat can be prevented.

Moreover, the shielding film also functions as the reinforcing film. Thus, the mechanical strength of the semiconductor device can be improved by the shielding film.

What is claimed is:

1. A semiconductor device comprising:
   a semiconductor substrate;
   an interlayer insulating film formed over the semiconductor substrate;
   wirings formed on the interlayer insulating film;
   a first insulating film formed on the wirings and the interlayer insulating film;
   a shielding film formed on the first insulating film, the shielding film is not electrically connected to the wirings and to the semiconductor substrate, and the shielding film made of an element or alloy of Al, Au, Ag, Pt, Cu, Mo, Ta, Ti, or W and does not contain silicon;
   a second insulating film formed on the shielding film; and
   a thin-film transistor which is formed on the second insulating film and has a polycrystalline semiconductor film as a channel.

2. The semiconductor device according to claim 1, wherein the shielding film has a function to do any of reflection and attenuation of an energy beam.

3. The semiconductor device according to claim 1, wherein the shielding film is in an electrically floating state.

4. The semiconductor device according to claim 1, wherein a MOS transistor is formed on the semiconductor substrate and the interlayer insulating film is formed on the MOS transistor.

5. A semiconductor device comprising:
- a semiconductor substrate;
- an interlayer insulating film formed over the semiconductor substrate;
- wirings formed on the interlayer insulating film;
- a first insulating film formed on the wirings and the interlayer insulating film;
- a shielding film formed on the entire surface of the first insulating film, the shielding film is not electrically connected to the wirings and to the semiconductor substrate, and the shielding film made of an element or alloy of Al, Au, Ag, Pt, Cu, Mo, Ta, Ti, or W and does not contain silicon;
- a second insulating film formed on the shielding film; and
- a thin-film transistor which is formed on the second insulating film and has a polycrystalline semiconductor film as a channel.

* * * * *